United States Patent
Nayanov et al.

(10) Patent No.: US 11,568,792 B2
(45) Date of Patent: Jan. 31, 2023

(54) DRIVER CHIP, LED LAMP AND LED DISPLAY SCREEN

(71) Applicant: NOVATRONICS CO., LIMITED, Hong Kong (HK)

(72) Inventors: Evgeniy Nayanov, Guangdong (CN); Yi Lin, Guangdong (CN)

(73) Assignee: NOVATRONICS CO., LIMITED, Hong Kong (HK)

( * ) Notice: Subject to any disclaimer, the term of this patent is extended or adjusted under 35 U.S.C. 154(b) by 125 days.

(21) Appl. No.: 17/126,080

(22) Filed: Dec. 18, 2020

(65) Prior Publication Data

US 2022/0198992 A1 Jun. 23, 2022

(51) Int. Cl.
*G09G 3/00* (2006.01)
*G09G 3/20* (2006.01)
*H01L 25/16* (2006.01)
*G09G 3/32* (2016.01)

(52) U.S. Cl.
CPC .......... *G09G 3/2096* (2013.01); *G09G 3/32* (2013.01); *H01L 25/167* (2013.01); *G09G 2310/0283* (2013.01)

(58) Field of Classification Search
None
See application file for complete search history.

(56) References Cited

U.S. PATENT DOCUMENTS

| 10,917,953 | B2 * | 2/2021 | Meitl | H05B 45/50 |
| 2005/0264472 | A1 * | 12/2005 | Rast | G09G 3/14 |
| | | | | 345/30 |

FOREIGN PATENT DOCUMENTS

| CN | 1889063 A | 1/2007 |
| CN | 103345885 A | 10/2013 |
| CN | 203552657 U | 4/2014 |
| CN | 104361864 A | 2/2015 |
| CN | 105489127 A | 4/2016 |
| CN | 106157875 A | 11/2016 |
| CN | 209183247 U | 7/2019 |

\* cited by examiner

Primary Examiner — Michael A Faragalla

(57) ABSTRACT

To solve the problems of complicated wiring and color difference between LED lamps in adjacent lines in the prior art, the application provides a driver chip, an LED lamp and an LED display screen. On the one hand, the application provides an LED lamp, which further comprises a data direction judgment & switch module arranged inside or outside the driver chip and connected with the driving module; The two signal ends of the LED lamp provided by the application can input and output data signals without distinguishing data directions. Judging the data signal directions of the first signal end and second signal end by the data direction judgment & switch module, automatically switching the input end and output end of the data signals, the wiring complexity is greatly reduced. And there is no color difference among the LED lamps in adjacent rows or columns.

18 Claims, 17 Drawing Sheets

| 202 | 1 | 0 | 1 | 0 |
| --- | --- | --- | --- | --- |
| 203 | 1 | 0 | 0 | 1 |
| 2003 | 1 | 1 | 0 | 1 |

DRIVER CHIP, LED LAMP AND LED DISPLAY SCREEN

TECHNICAL FIELD

The application belongs to the field of LEDs, in particular to an LED lamp with a built-in driver IC.

BACKGROUND

LED display screen is known to the public, which forms a display screen by arranging LED lamps in arrays. At present, the more advanced way in the market is to use LED lamp with built-in driver IC to make an LED display screen. As shown in FIG. 1, the LED lamp 100' includes a driver IC 2', the driver IC 2' is provided with a plurality of signal ports and power ports; the power port includes a positive port and a negative port, which are connected with an external power supply to form a power circuit, providing power for the driver IC 2' and light emitting chip; the signal port comprises a signal input end and a signal output end; a control signal enters the signal input end from the control module of the LED display screen or the upper LED lamp 100', and the control signal is transmitted to the lower LED lamp 100' from the signal output end. A control port (not shown in the figure) is arranged inside and connected to three light emitting chips 1' (blue light emitting chip, green light emitting chip and red light emitting chip), and the three light emitting chips 1' share an anode (or a cathode).

At present, when the LED lamp 100' is arrayed to form an LED display screen 1000', its signal end has a signal input end and a signal output end; It is required that the control signal always enters from the signal input end and outputs from the signal output end. As shown in FIG. 2, if the lamp beads of all LED lamps 100' are arranged in the same way, taking the control signal as an example, which is conducted horizontally (or vertically in columns), the LED lamps 100' in the same row are conducted in turn, and the LED lamps 100' of adjacent rows are connected head-to-tail through signal lines. Specifically, the LED lamps 100' in each row are connected in series from left to right, and when it reaches the last LED lamp in each row, the signal output end of the last LED lamp 100' is connected in series with the signal input end of the next row through a signal line, and the conduction is restarted. The disadvantage of this method is that the head-to-tail signal lines between adjacent rows of LED lamps 100' have to go around a long distance, which increases the complexity of wiring. Especially, in the field of transparent LED display screen 1000', the requirements for circuit design are very simple. Winding from scratch will increase the complexity of circuit design and make other functions (such as the arrangement of conductive circuits) difficult.

In order to make the wiring simpler, as shown in FIG. 3, the applicant rotates the LED lamps 100' of adjacent rows by 180 degrees and installs them in reverse, and connects the heads or tails in series between adjacent rows. For example, odd rows are installed in the forward direction and even rows are installed in the reverse direction; The signal input end of odd row is on the left, the signal output end of odd row is on the right, and the control signal is transmitted from left to right. Conversely, the signal input end of even row is on the right, the signal output end of even row is on the left, and the control signal is transmitted from right to left. However, this method has the following problems: the arrangement directions of the three light emitting chip in the adjacent rows of LED lamps 100' are just opposite, which will cause color difference between the left and right viewing angles of the adjacent rows of LED lamps 100' after the LED display screen 1000' is imaged.

SUMMARY

To solve the problems of complicated wiring and color difference between LED lamps in adjacent lines in the prior art, the application provides a driver chip, an LED lamp and an LED display screen.

The first aspect of the application provides a driver chip, the driver chip is internally provided with a driving module and connected with a signal end and a power port; the power port is used for providing power for the driver chip; the signal end is used for inputting and outputting data signal;

the driver chip further comprises a data direction judgment & switch module connected with the driving module;

the signal end comprises a first signal end and a second signal end;

and the data direction judgment & switch module is connected with the first signal end and the second signal end and used for judging data signal input directions of the first signal end and the second signal end, automatically switching signal input end and signal output end for the data signal, importing and transmitting the data signal from the signal input end to the driving module, receiving the data signal returned from the driving module, and outputting the data signal from the signal output end.

According to the driver chip provided by the application, the signal end connected with the driver chip can input and output data signals without distinguishing data directions. It judges the data signal input directions of the first signal end and the second signal end by the data direction judgment & switch module, identifies signal input end and signal output end for the data signal, inputs data signal from the data input and outputs the data signal to the driving module, receives data signal returned from the driving module, and outputs the data signal from the data output. Therefore, when it is used in LED display screen and other equipment, the arrangement or wiring of each LED lamp does not need to be specially designed. Under the condition that the arrangement direction of the LED lamp does not need to be changed among rows (or columns), the heads or tails of the LED lamps of adjacent rows (or adjacent columns) are connected in series, thus avoiding the use of head-to-tail wiring for winding layout and greatly reducing the complexity of wiring. And there is no color difference between the LED lamps in adjacent rows or columns.

Further, the driving module comprises a data input and a data output;

the data direction judgment & switch module comprises a data input circuit, a data output circuit and a watchdog;

the data input circuit comprises two input branches connected to the data input, and the two input branches are respectively connected to the first signal end and second signal end;

the data output circuit comprises two output branches connected to the data output, and the two output branches are respectively connected to the first signal end and second signal end;

the watchdog is used for judging the data signal input directions of the first signal end and the second signal end, and controlling selection of input branches from the data input circuit and output branches from the data output circuit, so that the data signal is always input from one signal end and output from the another end.

Further, the data input circuit comprises a data direction selector; the data input circuit comprises a data direction selector; the data direction selector is connected with the first signal end, second signal end, watchdog and the data input of the driving module; the data direction selector is connected with the first signal end and the second signal end to form two input branches, and used for switching signal input end connected with data signal according to control signal sent by the watchdog, selecting input branches and outputting data signal from the data direction selector to the data input of the driving module;

the data output circuit is connected to the data output of the driving module, and includes two output branches provided with two switch devices, the two output branches are respectively connected to the first signal end and the second signal end, and the two switch devices always work in inverted states;

the watchdog is directly or indirectly connected with the data input, data output, data direction selector and switch devices on data output circuit, and is used for collecting signals of the data input and data output and identifying signal input end and signal output end of data signal; and sending control signal to the data direction selector and two switch devices on the data output circuit, and an inverter is provided on lines of the two switch devices or the watchdog, but not both.

Further, the data direction selector comprises a first signal port, a second signal port, a data output and a selection port;

the first signal end is connected with the first signal port through a first diode, and the second signal end is connected with the second signal port through a second diode; the data output is connected to the data input of the driving module;

the data output of the driving module is connected to the first signal end through a first switch device and connected to the second signal end through a second switch device;

the watchdog comprises an input signal collection port, an output signal collection port and a control port;

the input signal collection port is connected to the first signal port of the data direction selector; the output signal collection port is connected to the data output of the driving module; the control port is connected to selection port of the data direction selector and control ends of the first switch device and second switch device, and an inverter is arranged on the control port and the control end of the second switch device; or the input signal collection port is connected to the second signal port of the data direction selector; the output signal collection port is connected to the data output of the driving module; the control port is connected to selection port of the data direction selector and control ends of the first switch device and second switch device, and an inverter is arranged on the control port and the control end of the first switch device.

Further, the watchdog comprises a signal detection module and a counter;

and the signal detection module is connected with the input signal collection port and the output signal collection port and is provided with a detection output port; the signal detection module makes logical judgment according to signals collected by the input signal collection port and the output signal collection port, and outputs a detection signal from the detection output port; if it conforms to a specific logic, the detection signal output to the counter is a low level 0, and the counter is reset; otherwise, the detection signal output to the counter is a high level 1, so that the counter counts;

the counter is used for counting within a preset time, and if counting reaches or exceeds a preset value, output control signal is judged to be a high level 1; otherwise, output control signal is a low level 0.

Further, rules of logic judgment of the signal detection module is as follows: when signals collected by the input signal collection port and the output signal collection port are not equal, and signal collected by the input signal collection port is a low level 0, signal collected by output signal collection port is a high level 1, then the detection signal output by detection output port is a low level 0; otherwise, the detection signal output by detection output port is a high level 1.

Further, the frequency of the signal collected by the signal detection module is far greater than the frequency of the data signal.

the data signal is input and output from the driving module by first-in-first-out rule; and the preset time is greater than an input time and output time of the data signal from the driving module.

Further, the driving module includes a logic circuit module and an analog circuit module;

the logic circuit module is used for receiving data signal input by the data input, extracting control signal from the data signal and transmitting the control signal to the analog circuit module, and outputting the data signal from the data output;

the analog circuit module is used for generating a plurality of driving signals corresponding to the number of light emitting chips according to the data signal, to drive the corresponding light emitting chips.

Further, the data input circuit comprises a first AND gate, a second AND gate and an OR gate; wherein the first signal end is connected to an input end of the first AND gate through a fourth diode to form a first input branch; the second signal end is connected to an input end of the second AND gate through a fifth diode to form a second input branch; output ends of the first AND gate and the second AND gate are connected to an input end of the OR gate, and an output end of the OR gate is connected to the data input;

the data output circuit comprises a first output branch and a second output branch, the first output branch is connected between the first signal end and the data output through a third switch device; and the second output branch is connected between the second signal end and the data output through a fourth switch device;

the watchdog comprises a control input port and a control output port, wherein the control input port is connected to an output end of a third AND gate, and an input end of the third AND gate is connected to the data output and the other input end is connected to the first signal end through a second NOT gate; and the control output port is connected to the other input end of the second AND gate and a control end of the third switch device, and is connected to the other input end of the first AND gate and a control end of the fourth switch device through a first NOT gate.

The second aspect of the application provides an LED lamp, comprising a driver chip, a light emitting chip, a signal port and a power port, wherein a driving module is arranged in the driver chip; and the power port is used for providing power for circuits in the LED lamp; the signal port is used for inputting and outputting data signal; the light emitting chip is connected to the driver chip and driven by the driving module;

the signal end comprises a first signal end and a second signal end;

the LED lamp further comprises a data direction judgment & switch module arranged inside or outside the driver chip and connected with the driving module;

and the data direction judgment & switch module is connected with the first signal end and the second signal end and used for judging data signal input directions of the first signal end and the second signal end, automatically switching signal input end and signal output end for the data signal, importing and transmitting the data signal from the signal input end to the driving module, receiving the data signal returned from the driving module, and outputting the data signal from the signal output end.

According to the LED lamp provided by the application, the two signal ends can input and output data signals without distinguishing data directions. It judges the data signal input directions of the first signal end and the second signal end by the data direction judgment & switch module, identifies signal input end and signal output end for the data signal, inputs data signal from the data input and outputs the data signal to the driving module, receives data signal returned from the driving module, and outputs the data signal from the data output. Therefore, when it is used in LED display screen and other equipment, the arrangement or wiring of each LED lamp does not need to be specially designed. Under the condition that the arrangement direction of the LED lamp does not need to be changed among rows (or columns), the heads or tails of the LED lamps of adjacent rows (or adjacent columns) are connected in series, thus avoiding the use of head-to-tail wiring for winding layout and greatly reducing the complexity of wiring. And there is no color difference between the LED lamps in adjacent rows or columns.

Further, the data direction judgment & switch module is set in the driver chip.

Further, the driving module comprises a data input and a data output;

the data direction judgment & switch module comprises a data input circuit, a data output circuit and a watchdog;

the data input circuit comprises two input branches connected to the data input, and the two input branches are respectively connected to the first signal end and second signal end;

the data output circuit comprises two output branches connected to the data output, and the two output branches are respectively connected to the first signal end and second signal end;

the watchdog is used for judging the data signal input directions of the first signal end and the second signal end, and controlling selection of input branches from the data input circuit and output branches from the data output circuit, so that the data signal is always input from one signal end and output from the another end.

Further, the data input circuit comprises a data direction selector; the data input circuit comprises a data direction selector; the data direction selector is connected with the first signal end, second signal end, watchdog and the data input of the driving module; the data direction selector is connected with the first signal end and the second signal end to form two input branches, and used for switching signal input end connected with data signal according to control signal sent by the watchdog, selecting input branches and outputting data signal from the data direction selector to the data input of the driving module;

the data output circuit is connected to the data output of the driving module, and includes two output branches provided with two switch devices, the two output branches are respectively connected to the first signal end and the second signal end, and the two switch devices always work in inverted states;

the watchdog is directly or indirectly connected with the data input, data output, data direction selector and switch devices on data output circuit, and is used for collecting signals of the data input and data output and identifying signal input end and signal output end of data signal; and sending control signal to the data direction selector and two switch devices on the data output circuit, and an inverter is provided on lines of the two switch devices or the watchdog, but not both.

Further, the watchdog comprises a signal detection module and a counter;

and the signal detection module is connected with the input signal collection port and the output signal collection port and is provided with a detection output port; the signal detection module makes logical judgment according to signals collected by the input signal collection port and the output signal collection port, and outputs a detection signal from the detection output port; if it conforms to a specific logic, the detection signal output to the counter is a low level 0, and the counter is reset; otherwise, the detection signal output to the counter is a high level 1, so that the counter counts;

the counter is used for counting within a preset time, and if counting reaches or exceeds a preset value, output control signal is judged to be a high level 1; otherwise, output control signal is a low level 0.

Further, rules of logic judgment of the signal detection module is as follows: when signals collected by the input signal collection port and the output signal collection port are not equal, and signal collected by the input signal collection port is a low level 0, signal collected by output signal collection port is a high level 1, then the detection signal output by detection output port is a low level 0; otherwise, the detection signal output by detection output port is a high level 1.

Further, the frequency of the signal collected by the signal detection module is far greater than the frequency of the data signal.

the data signal is input and output from the driving module by first-in-first-out rule; and the preset time is greater than an input time and output time of the data signal from the driving module.

Further, the driving module includes a logic circuit module and an analog circuit module;

the logic circuit module is used for receiving data signal input by the data input, extracting control signal from the data signal and transmitting the control signal to the analog circuit module, and outputting the data signal from the data output;

the analog circuit module is used for generating a plurality of driving signals corresponding to the number of light emitting chips according to the data signal, to drive the corresponding light emitting chips.

Further, the data input circuit comprises a first AND gate, a second AND gate and an OR gate; wherein the first signal end is connected to an input end of the first AND gate through a fourth diode to form a first input branch; the second signal end is connected to an input end of the second AND gate through a fifth diode to form a second input branch; output ends of the first AND gate and the second AND gate are connected to an input end of the OR gate, and an output end of the OR gate is connected to the data input;

the data output circuit comprises a first output branch and a second output branch, the first output branch is connected between the first signal end and the data output through a third switch device; and the second output branch is connected between the second signal end and the data output through a fourth switch device;

the watchdog comprises a control input port and a control output port, wherein the control input port is connected to an output end of a third AND gate, and an input end of the third AND gate is connected to the data output and the other input end is connected to the first signal end through a second NOT gate; and the control output port is connected to the other input end of the second AND gate and a control end of the third switch device, and is connected to the other input end of the first AND gate and a control end of the fourth switch device through a first NOT gate.

The third aspect of the present application provides an LED display screen.

The LED display screen provided by the application is internally arranged with the above improved and innovated LED lamps, so that the arrangement or wiring of each LED lamp does not need to be specially designed. Under the condition that the arrangement direction of the LED lamp does not need to be changed among rows (or columns), the heads or tails of the LED lamps of adjacent rows (or adjacent columns) are connected in series, thus avoiding the use of head-to-tail wiring for winding layout and greatly reducing the complexity of wiring. And there is no color difference between the LED lamps in adjacent rows or columns.

Further, the LED lamps form LED arrays, and the LED arrays are arranged in the same direction.

Further, the LED display screen also includes a data control module;

the data control module is provided with a plurality of first data ports and second data ports; part of the LED lamps of the LED array are connected in series among the first data ports and the second data ports.

Further, arrays composed of LED lamps connected in series among the first data ports and the second data ports are divided into a plurality of rows or columns connected in series, and the LED lamps of adjacent rows or adjacent columns are connected head-to-head or tail-to-tail.

Further, the data control module comprises two physical network interfaces, an FPGA and a memory;

the FPGA includes a data collection & transmit module, a first output module, a second output module and a break-off monitoring module;

the data collection & transmit module is connected with the two physical network interfaces and the memory, and is used for collecting and sending data packet, and obtaining data signal from the data packet and storing the data signal in the memory;

the first output module is used for calling the data signal stored in the memory and sending the data signal to corresponding serially connected LED lamps through the first data port;

the second output module is used for reversely calling the data signal stored in the memory as backup signal, and sending the backup signal to corresponding serially connected LED lamps through the second data port;

a backup switch device is arranged between the second output module and the second data port, and the backup switch device is used for controlling the on-off of the backup signal sent by the second output module;

the break-off monitoring module is connected to a control end of the backup switch device and to the second data port through a third diode, and is used for collecting data of the second data port and outputting a backup control signal to the control end of the backup switch device.

The FPGA in the data control module is provided with a first output module, a second output module and an interrupt detection module, data signal can be forward input into the corresponding LED lamp assembly connected in series through the first output module, when an LED lamp in the series-connected lamp assembly breaks down, the break-off monitoring module can monitor the state of the second data port and judge that no data signal has been received; at this time, it can control the backup switch device to turn on, so that it can send the backward backup signal out through the second output module. Ensuring that the LED lamp behind the damaged LED lamp can still work properly.

Figure 1:
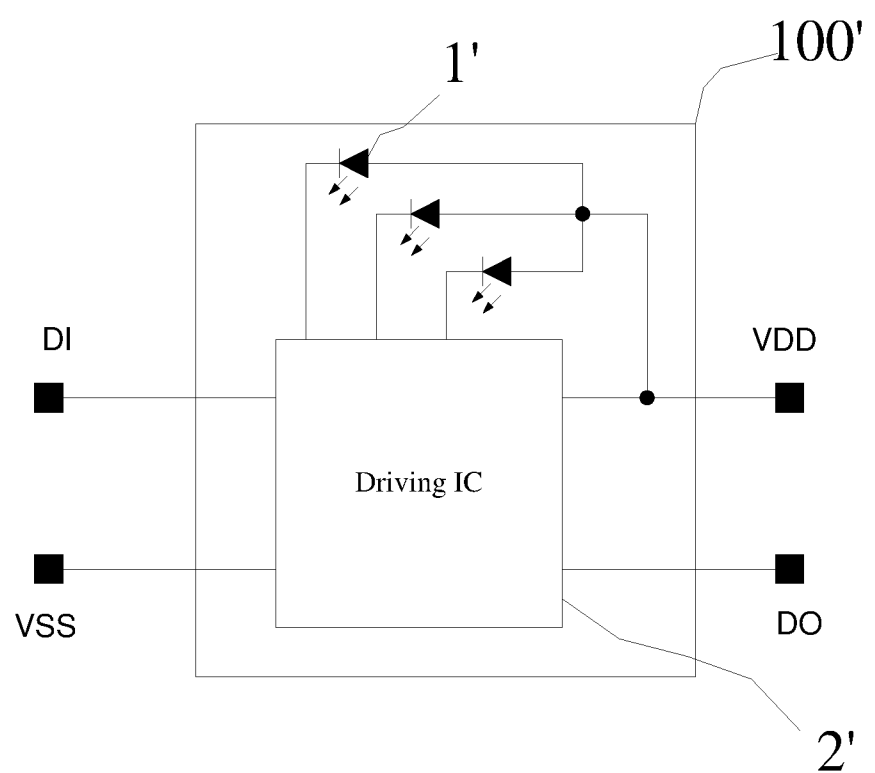
FIG. 1 is a schematic diagram of a circuit frame of an LED lamp provided in the prior art.
Figure 2:
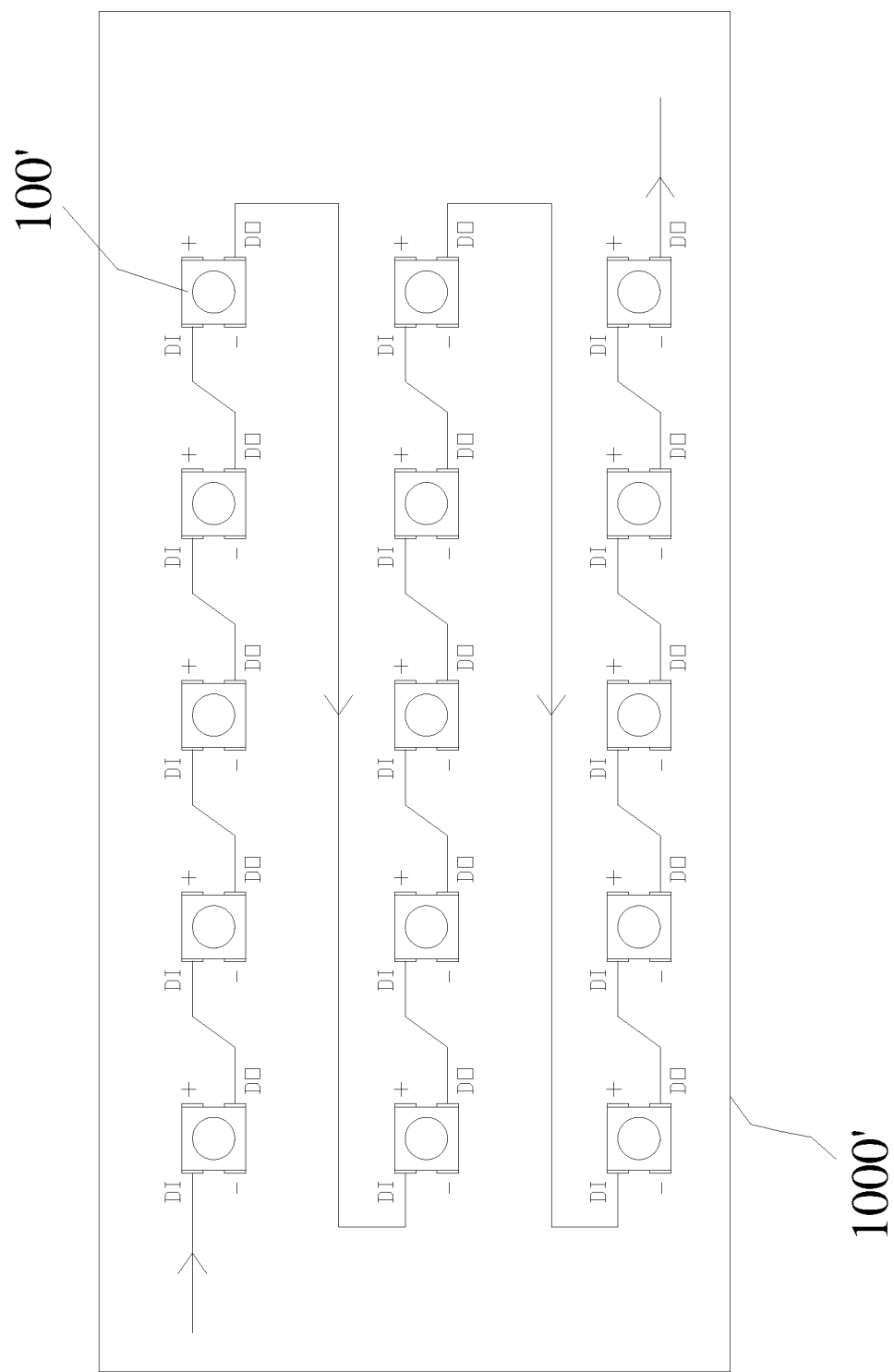
FIG. 2 is a schematic diagram of a circuit frame of an LED display screen provided in the prior art.
Figure 3:
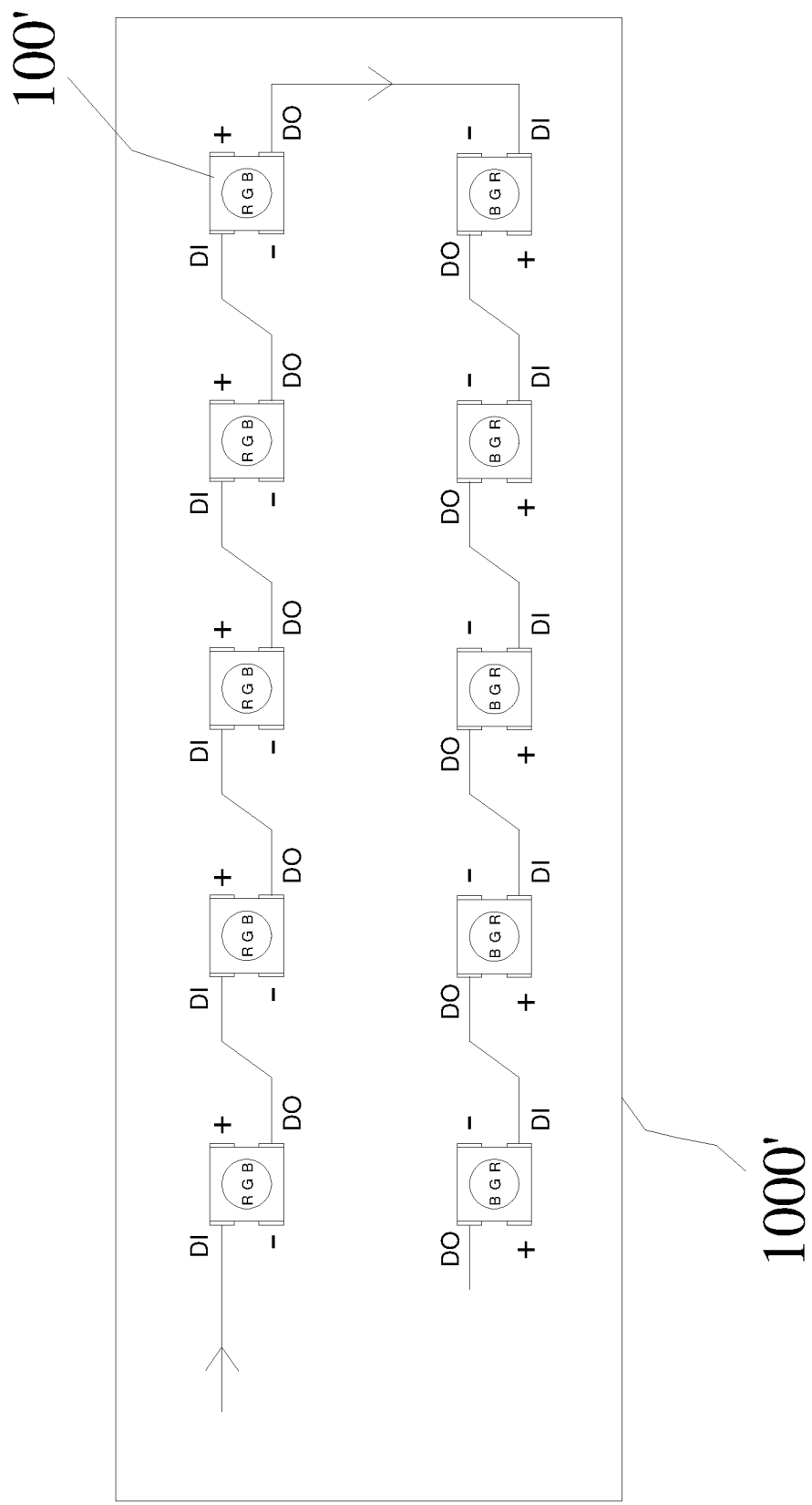
FIG. 3 is a schematic diagram of a circuit frame of an another LED display screen provided in the prior art.

Wherein, the reference numeral in the Background are as follows:
1'. Light Emitting Chip; 2'. Driver IC; 100'. LED Lamp; 1000'. LED Display Screen;

And the reference numeral in the embodiments of the present application are as follow:
1000. LED Display Screen;
100. LED Lamp; 100a. First Signal End; 100b. second signal end; 100c. First Power Supply End;
100d. Second Power Supply End;
1. Light Emitting Chip; 2. Driver Chip;
21. Driving Module; 20. Data Direction Judgment & Switch Module;
210. Logic Circuit Module; 211. Analog Circuit Module;
200. Watchdog; 201. Control Port; 202. Output Signal Collection Port; 203. input signal collection port; 204. Inverter; 205. Data Direction Selector; 206. First Diode; 207. First Switch Device; 208. Second Diode; 209. Second Switch Device; DI. Data Input; DO. Data Output;
2001. Signal Detection Module; 2002. Counter; 2003. Detection Output Port;
300. Data Control Module; 300a. First Data Port; 300b. Second Data Port; 301. FPGA; 302. SDRAM; 303. First Physical Network Interface; 304. Second Physical Network Interface; 3011. First Output Module; 3012. Second Output Module; 3013. Data Collection & Transmit Module; 3014. Backup Switch Device; 3015. Break-off Monitoring Module; 3016. Third Diode;
401. Fourth Diode; 402. Third Switch Device; 403. First AND Gate; 404. OR Gate; 405. Second AND Gate; 406. First NOT Gate; 407. Second NOT Gate; 408. Third AND Gate; 409. Fifth Diode; 410. Fourth Switch Device; 222. Control Output Port; 333. Control Input Port.

DETAILED DESCRIPTION

In order to make the technical problems to be solved, technical solutions and beneficial effects clearer, the present application will be further described in detail with reference to the drawings and embodiments. The preferred embodiments of the present disclosure are described in detail with reference to the accompanying drawings. It should be understood that the preferred embodiments described below are merely used to illustrate and explain the present disclosure, and not intended to limit the present disclosure.

In the description of the present disclosure, it should be understood that the orientations or positional relationships indicated by the terms "longitudinal", "radial", "length", "width", "thickness", "upper", "lower", "front", "rear", "left", "right", "vertical", "horizontal", "top", "bottom", "inside" and "outside" are based on the orientations or positional relationships shown in the drawings, which are only for the convenience of describing the present disclosure and simplifying the description, but do not indicate or imply that the referred devices or elements must have a specific orientation, be constructed or operated in a specific orientation, so they cannot be understood as limiting the present disclosure. In the description of the present disclosure, unless otherwise specified, "plurality" means two or more. The singular terms "a", "an" and "the" include plural reference and vice versa unless the context clearly indicates otherwise.

In the description of the present disclosure, it should be noted that the terms "install", "connect to" and "connect with" should be understood in a broad sense, for example, they can be fixed connection, detachable connection or integrated connection; It can be connected mechanically or electrically. It can be directly connected, indirectly connected through an intermediate medium, or communicated inside two elements. For those of ordinary skill in the art, the specific meanings of the above terms in the present disclosure can be understood in specific situations.

Embodiment 1

In this embodiment, the improvement of the LED lamp 100 and the driver chip 2 disclosed will be explained in detail. The driver chip 2 can be protected as a separate protection subject, which will be explained in detail in accompany with the LED lamp 100, but it does not indicate that only the LED lamp 100 is protected but not the driver chip 2. The description in this embodiment is also sufficient to support the technical solution of the driver chip.

Figure 4:
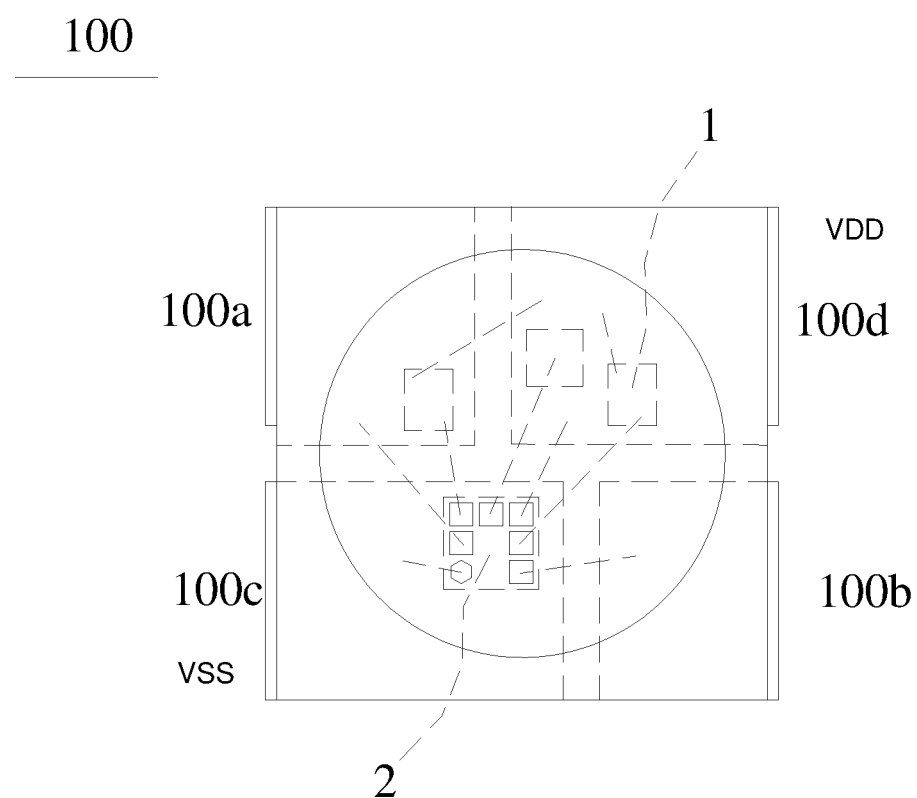
FIG. 4 is a schematic diagram of the package structure of the LED lamp provided in an embodiment of the present disclosure.

The mechanical structure of the LED lamp 100 disclosed in this embodiment is shown in FIG. 4, which includes a driver chip 2 (Driving IC), a light emitting chip 1, a signal end and a power port. Generally, if it is made as lamp bead, it usually needs to be packaged by a bracket, but in this embodiment, it does not necessarily need to be packaged in practical application. It can be directly used in LED display screen 1000 by COB (Chip On Board) or COG (Chip On Glass). Therefore, the inventive concept of this application can be realized as long as there are the core components driver chip 2, light emitting chip 1 and the improved innovative data direction judgment & switch module 20. The LED lamp 100 of this application does not need to be packaged in the form of lamp beads. The basic structure of the LED lamp 100 is known to the public, so the details of the basic structure in the LED lamp 100 will not be explained, but only how to add a new data direction judgment & switch module 20 in the driver chip 2 (or outside the driver chip 2 in the LED lamp 100) will be explained in this application.

The power port is used to provide power for the circuits in the LED lamp 100, that is, to provide power for the driver chip 2 and the light emitting chip 1. The signal end is used for inputting and outputting data signal. In this embodiment, the signal end includes a first signal end 100a and a second signal end 100b. The power port includes a first power supply end 100c and a second power supply end 100d. In this embodiment, for convenience of explanation, the first signal end 100a is placed on the left side and the second signal end 100b is placed on the right side. The data signal can be input from the first signal end 100a and output from the second signal end 100b, where the first signal end 100a serves as a signal input end for data signal and the second signal end 100b serves as a signal output end for data signal. Obviously, the data signal can also be input from the second signal end 100b and output from the first signal end 100a. In this case, the second signal end 100b serves as a signal input end for data signal and the first signal end 100a serves as a signal output end for data signal. In this embodiment, the first power supply end 100c is negative electrode (or earth ground) VSS, and the second power supply end 100d is positive electrode (VDD).

Figure 5:
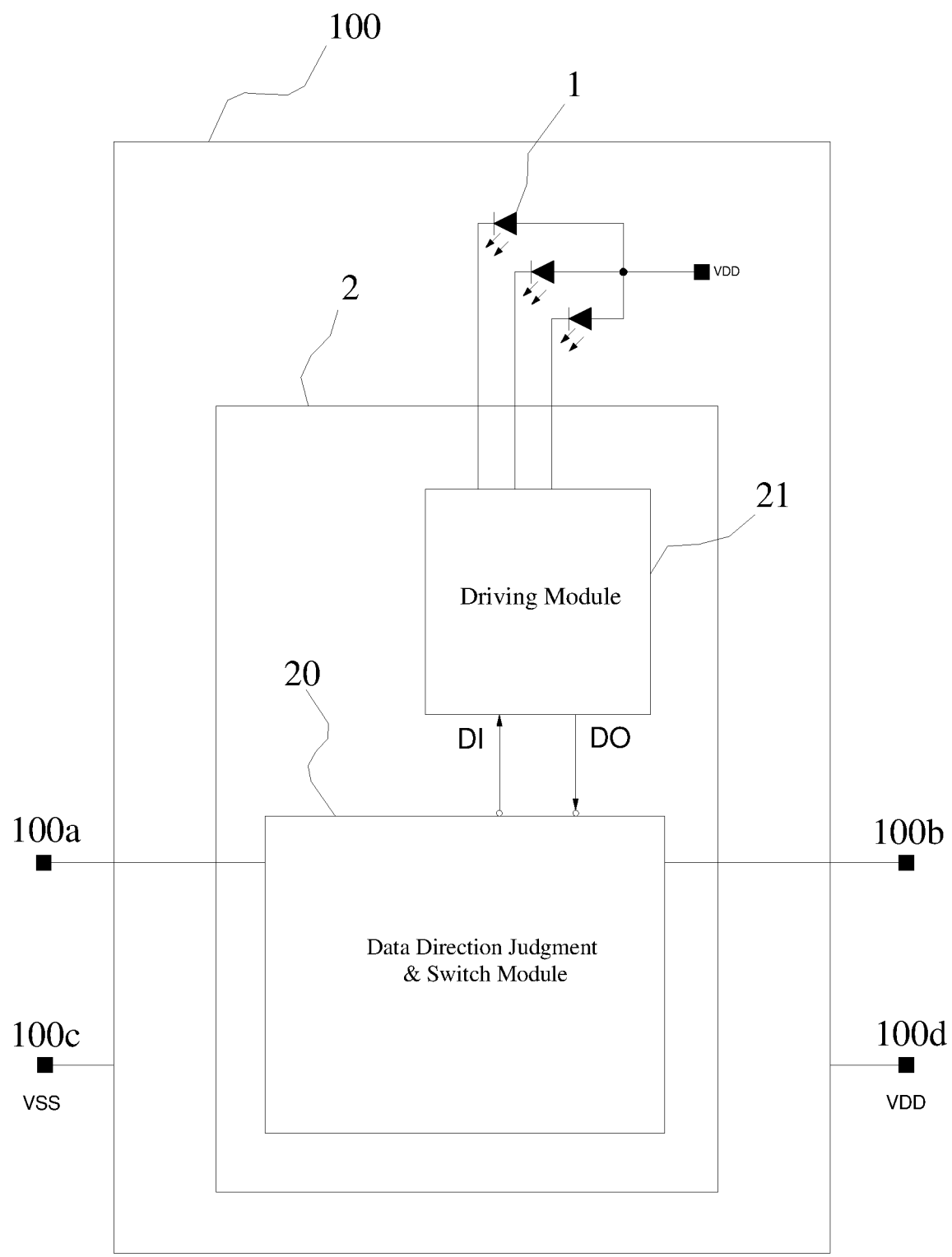
FIG. 5 is a schematic diagram of a circuit frame of the LED lamp provided in an embodiment of the present disclosure.

As shown in FIG. 5, a driving module 21 (DM) is installed in the driver chip 2. The light emitting chip 1 is connected to the driver chip 2 and driven by the driving module 21. In this embodiment, the LED lamp 100 further includes a data direction judgment & switch module 20 disposed in the driver chip 2 and connected with the driving module 21; As an alternative, the data direction judgment & switch module 20 can also be set outside the driver chip 2. Of course, preferably, the data direction judgment & switch module 20 connected with the driving module 21 is integrated in the driver chip 2 to further reduce the size of the LED lamp 100, which is a better solution. If the data direction judgment & switch module 20 is set outside the driver chip 2 and its function is realized by analog circuit, its advantage is that there is no need to change the driver chip 2, but it has new requirements for the LED lamp 100, so it is necessary to set an analog circuit outside the driver chip 2 to realize its function, which makes the structure more complex and may increase the size of the LED lamp 100.

The data direction judgment & switch module 20 (DDJSM) is connected with the first signal end 100a and the second signal end 100b, and used for judging the data signal input directions of the first signal end 100a and the second signal end 100b, automatically switching signal input end and signal output end for the data signal, importing and transmitting the data signal from the signal input end to the driving module 21, receiving the data signal returned from the driving module 21, and outputting the data signal from the signal output end.

The specific implementation form of the data direction judgment & switch module 20 is not particularly limited. As long as it can judge the data input direction, identify which signal end the data signal is input from, input the data signal from the identified signal input end, and then output it from the data output end in the data direction judgment & switch module 20 after passing through the driving module 21.

Figure 6A:
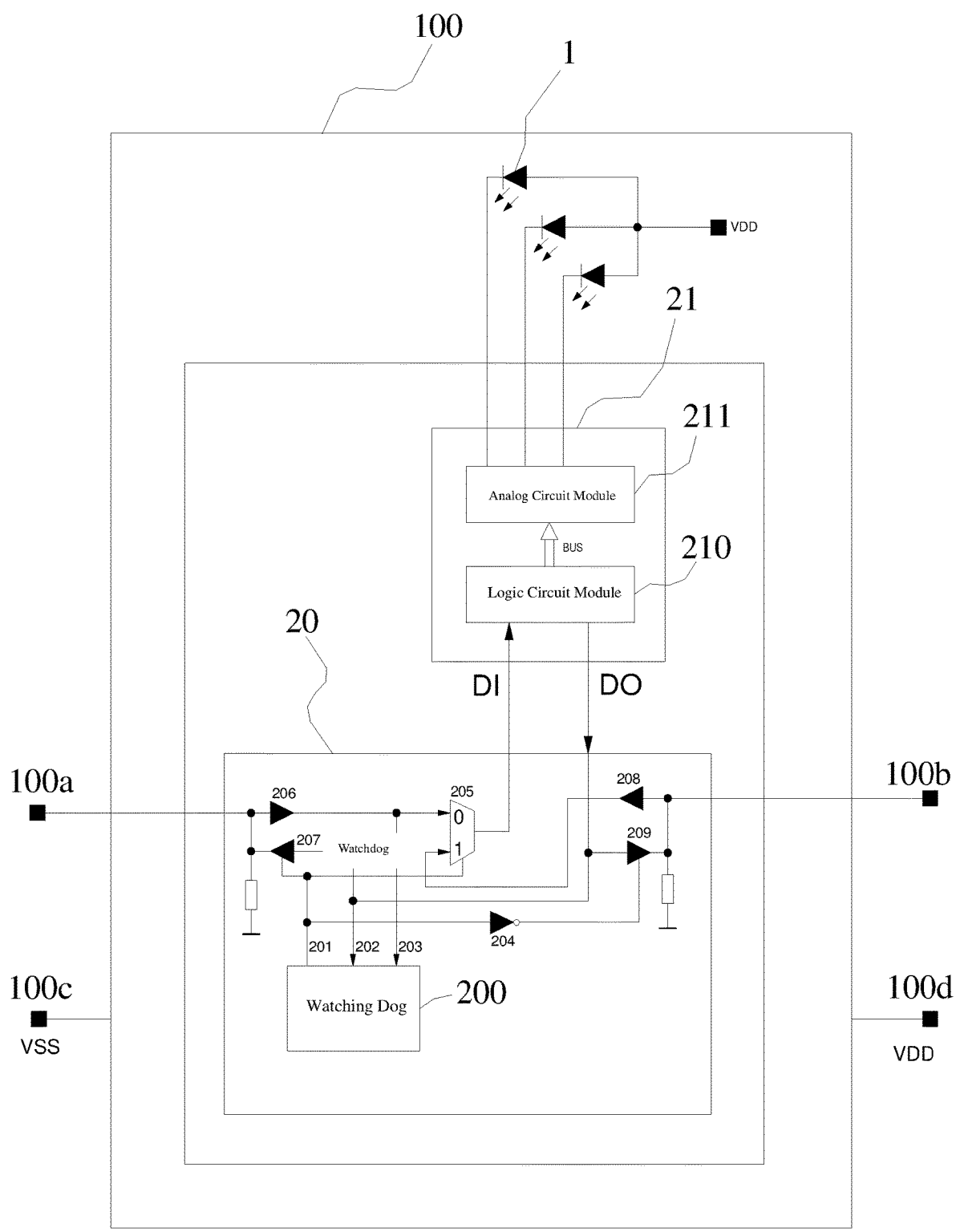
FIG. 6a is a schematic diagram of a further detailed circuit frame of the LED lamp provided in an embodiment of the present disclosure.

In this embodiment, a preferred implementation of the data direction judgment & switch module 20 and the driving module 21 of the LED lamp 100 is given as shown in FIG. 6a. Wherein, the driving module 21 includes a data input (DI) and a data output (DO), and its interior includes a logic circuit module 210 and an analog circuit module 211. The logic circuit module 210 is configured to receive data signal input by the data input DI, extract control signal from the data signal and transmit it to the analog circuit module 211, and output the data signal from the data output. The analog circuit module 211 is configured to generate a plurality of driving currents corresponding to the number of light emitting chips 1 according to the data signal, so as to drive the corresponding light emitting chips 1, and the three light emitting chips 1 are connected to a common cathode.

In this embodiment, there are three light emitting chips 1, namely blue light emitting chip (B), green light emitting chip (G) and red light emitting chip (R).

In this embodiment, the data direction judgment & switch module 20 includes a data input circuit, a data output circuit and a watchdog 200 (WD);

the data input circuit includes two input branches connected to the data input DI, and the two input branches are respectively connected to the first signal end 100a and second signal end 100b;

the data output circuit includes two output branches connected to the data output, and the two output branches are respectively connected to the first signal end 100a and second signal end 100b;

the watchdog 200 is used for judging the data signal input directions of the first signal end 100a and second signal end 100b, and controlling selection of input branches from the data input circuit and output branches from the data output circuit, so that the data signal is always input from one signal end and output from another signal end.

The logic of the above-mentioned switch device is that when the control end or the enable end inputs 0, the signal cannot pass, when the control end or the enable end inputs 1, the signal can pass (some switch devices can also be set to input 0 to pass the signal, and input 1 to fail the signal).

For example, the switch device can be a Three state gate. Three state refers that its output can be normal high-level (logic 1) or low-level (logic 0) of general binary logic circuit, and it can keep its characteristic high-impedance state (Hi-Z). When in high impedance state, the output resistance is very large, which is equivalent to open circuit without any logic control function. Three state gate have a control enable end (control end for short in this embodiment) to control the on-off of gate circuits. Devices with these three states are called three state gate (or three state device). When the input of control end is valid, the three state gate presents an output of normal 0" or "1"; When the input of control end is invalid, the three state gate gives an output of high impedance state.

Specifically, the data input circuit includes a data direction selector 205; the data direction selector 205 is connected with the first signal end 100a, second signal end 100b, watchdog 200 and the data input DI of the driving module 21, two input branches are formed and connected to the data input DI of the driving module 21, for switching the signal data input end according to the control signal sent by the watchdog 200, and outputting the data signal from the selector to the data input DI of the driving module 21. Specifically, for the sake of distinction, the input branch connecting the first signal end 100a and the data direction selector 205 is called first input branch; the output branch connecting second signal end 100b and the data direction selector 205 is called second output branch;

the data output circuit is connected to the data output DO of driving module 21, and includes two output branches provided with switch devices, which are respectively connected to the first signal end 100a and second signal end 100b, and for the sake of distinction, the output branch connecting the first signal end 100a is called first output branch; the output branch connecting the second signal end 100b is called second output branch; the two switch devices always work in inverted states; In this embodiment, the two switch devices are named first switch device 207 and second switch device 209 respectively. Wherein, the switch device connected with the first signal end 100a is first switch device 207, and the switch device connected with the second signal end 100b is second switch device 209. Because the two switch devices always work in inverted states, only one of the two output branches is chosen for output.

the watchdog 200 is connected with the data input DI, data output DO, data direction selector 205 and switch devices on data output circuit, and is used for collecting signals of the data input DI and data output DO, and identifying input end and output end of data signal; and sending control signal to the data direction selector 205 and two switch devices on the data output circuit, and an inverter is provided on lines of the two switch devices or the watchdog 200, but not both.

The arrangement of the input branch and the output branch makes the data signal always input from the input branch connected with one end and output from the output branch connected with the other end. That is, if a data signal is input into the data input DI of the driving module 21 from the first input branch connected to the first signal end 100a, the data signal output from the data output DO of the driving module 21 is output from the second output branch connected with the second signal end 100b. Conversely, if a data signal is input into the data input DI of the driving module 21 from the second input branch connected to the second signal end 100b, the data signal output from the data output DO of the driving module 21 is output from the first output branch connected with the first signal end 100a.

Further, the data direction selector 205 includes a first signal port, a second signal port, a data output DO and a selection port;

the first signal end 100a is connected with the first signal port through a first diode 206, that is, the first input branch is provided with a first diode 206, and the second signal end 100b is connected with the second signal port through a second diode 208, that is, the second input branch is provided with a second diode 208, the data output DO is connected to data input DI of the driving module 21;

the data output of the driving module 21 is connected to the first signal end 100a through a first switch device 207 and to the second signal end 100b through a second switch device 209. That is, the first switch device 207 is arranged on the first output branch, the second switch device 209 is arranged on the second output branch.

The watchdog 200 includes an input signal collection port 203, an output signal collection port 202 and a control port 201;

the input signal collection port 203 is connected to the first signal port of the data direction selector 205. The output signal collection port 202 is connected to data output of the driving module 21. The control port 201 is connected to the selection port of the data direction selector 205 and the control ends of the first switch device 207 and the second switch device 209, and an inverter 204 is arranged on the control port 201 and the control end of the second switch device 209.

The inverter 204 is set on the second switch device 209 because the input signal collection port 203 is connected to the first input branch, if the input signal collection port 203 is connected to the second input branch, the inverter 204 can be set on the first switch device 207. That is, the input signal collection port 203 is connected to the second signal port of the data direction selector 205. The output signal collection port 202 is connected to data output of the driving module 21. The control port 201 is connected to the selection port of the data direction selector 205 and the control ends of the first switch device 207 and the second switch device 209, and an inverter 204 is arranged on the control port 201 and the control end of the first switch device 207.

The purpose of this design is to make the input and output of data signal match the following results: when the data signal is input from the first input branch, the data signal is output from the second output branch; or when the data signal is input from the second input branch, the data signal is output from the first output branch.

To explain the working principle of watchdog 200 of the present application, firstly, the data signal of the application and the principle of collecting data by the watchdog are illustrated.

Figure 7:
FIG. 7 is a waveform diagram when there are no signals in the two signal ends.

FIG. 7 shows the waveform diagram of the first signal end 100a and the second signal end 100b when no signal is input. The first signal end 100a and the second signal end 100b are internally provided with pull-up resistors (not shown in the figure), so the signals of the first signal end 100a and the second signal end 100b are always output high level 1 when no signal is input.

Figure 8:
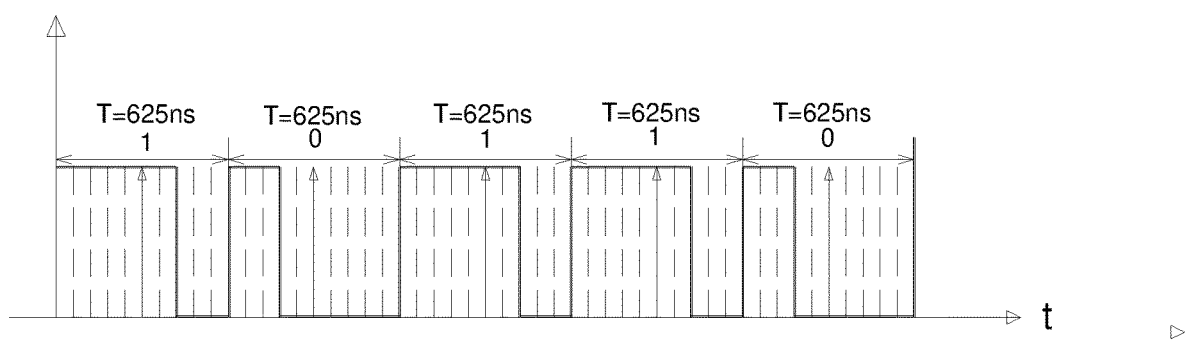
FIG. 8 is a waveform diagram when signals are input in the two signal ends.

FIG. 8 shows the waveforms of the first signal end 100a and the second signal end 100b when data signal is input or output. In the field of LED display, normally the frequency of data signal is 1.6 MHz, that is, the signal period is T=625 ns (Nanosecond). In the waveform diagram, a period always starts with a high level and then ends with a low level. If the duty ratio in a signal period is 70% (about 438 ns), it means that the signal characterized in a signal period is a high level 1, that is, the data of the data bit is 1. If the duty ratio in a signal period is 30% (about 187 ns), it means that the signal characterized in a signal period is a low level 0, that is, the data of the data bit is 0. The first-in-first-out rule (FIFO: First Input First Output) is adopted to shift the data signal into the data input DI of the driving module 21, and the data signal is shifted and output from the data output DO.

Figure 9:
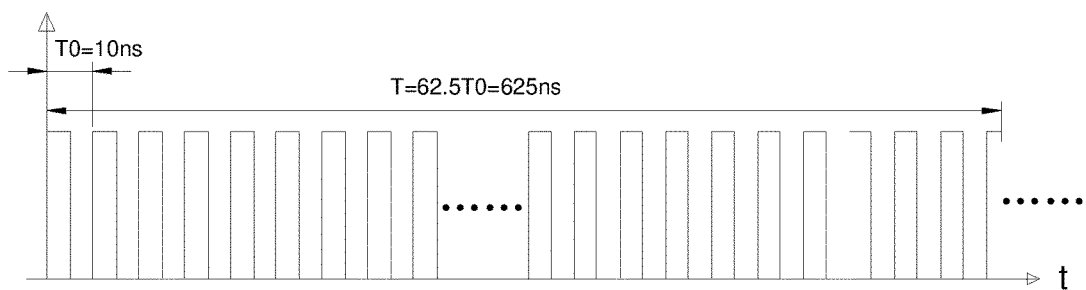
FIG. 9 is a schematic diagram of Acquisition Clock of the two signal collection ports in watchdog.

However, when the watchdog 200 is collecting signals, its clock of signal collection is as shown in FIG. 8, and its collecting frequency is set to be much higher than that of the above data signals, the collecting frequency is 100 MHz, which is much higher than that of the data signals. At this time, the clock period of signal collection is T0=10 ns, T=62.5 T0 (as shown in FIG. 9). Stated another way, in a signal period of a data signal, the watchdog 200 will collect signal for 62.5 times. If there is no signal transmission in the first signal end 100a or the second signal end 100b, the data collected by the watchdog 200 will always be a high level 1. If there is signal transmission, in a signal period, the signal collected by the watchdog 200 certainly includes part of high level 1 and part of low level 0. Since the input signal collection port 203 and the output signal collection port 202 collect the input data signal and output data signal respectively, the input signal collection port 203 and the output signal collection port 202 are not necessarily equal because of the first-in-first-out rule adopted for data transmission. In this way, as long as the low level 0 is collected by the input signal collection port 203, it indicates that data has been input.

Figures 10, 11:
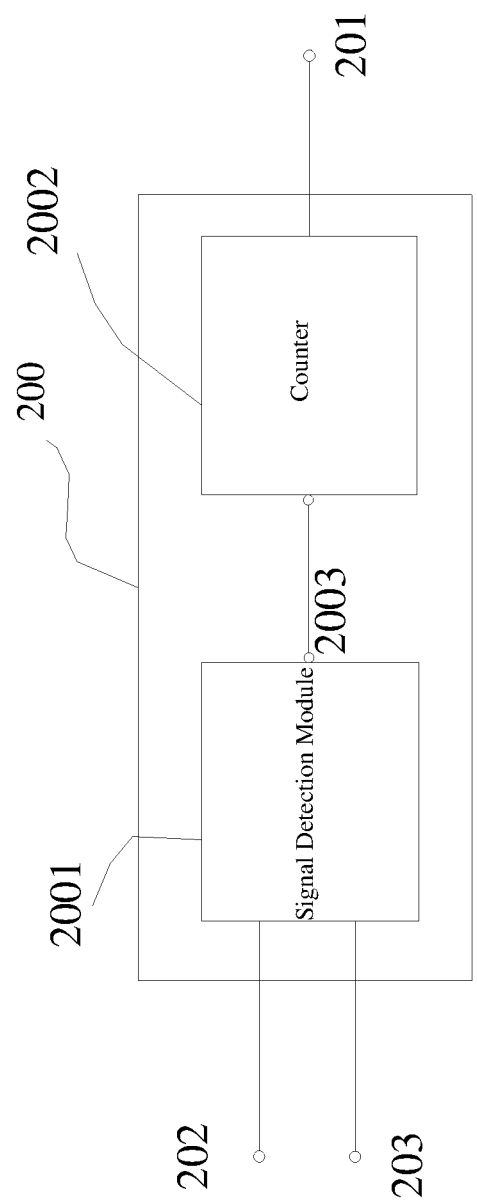
FIG. 10 is a schematic diagram of the internal circuit frame of watchdog.
FIG. 11 is the truth table of signal detection module in watchdog.

Specifically, as shown in FIG. 10, an embodiment of the watchdog 200 is explained below, the watchdog 200 includes a signal detection module 2001 and a counter 2002.

The signal detection module 2001 is connected with the input signal collection port 203 and the output signal collection port 202 and is provided with a detection output port 2003; the signal detection module 2001 makes logical judgment according to signals collected by the input signal collection port 203 and the output signal collection port 202, and outputs a detection signal from the detection output port 2003; if it conforms to a specific logic, the detection signal output to the counter 2002 is a low level 0, and the counter is reset; otherwise, the detection signal output to the counter 2002 is a high level 1, so that the counter 2002 counts;

the counter 2002 is used for counting within a preset time, and if counting reaches or exceeds a preset value, output control signal is judged to be a high level 1; otherwise, output control signal is a low level 0.

While the watchdog 200 is working, the counter 2002 is cumulative continuously. For example, when the default preset time is 200 μS (microsecond), the counter 2002 will count to a preset value of "a", when the accumulated count of the counter 2002 reaches "a", it continues to accumulate as "a", meanwhile the control signal output by the watchdog 200 is a high level 1, but when the value of the counter 2002 is less than "a", the control signal output by the watchdog 200 (WD) is a low level 0.

As shown in the table of FIG. 11, rules of logic judgment of the signal detection module 2001 is as follows: when signals collected by the input signal collection port 203 and the output signal collection port 202 are not equal, and signal collected by the input signal collection port 203 is a low level 0, signal collected by output signal collection port 202 is a high level 1, then the detection signal output by detection output port 2003 is a low level 0; otherwise, the detection signal output by detection output port 2003 is a high level 1.

That is, when the input signal collection port 203 is 0 and the output signal collection port 202 outputs 1, the detection output port 2003 outputs a low level 0; when the input signal collection port 203 is 1 and the output signal collection port 202 outputs 1, the detection output port 2003 outputs a low level 1; when the input signal collection port 203 is 0 and the output signal collection port 202 outputs 0, the detection output port 2003 outputs a low level 1; when the input signal collection port 203 is 1 and the output signal collection port 202 outputs 0, the detection output port 2003 outputs a low level 1.

Figure 12:
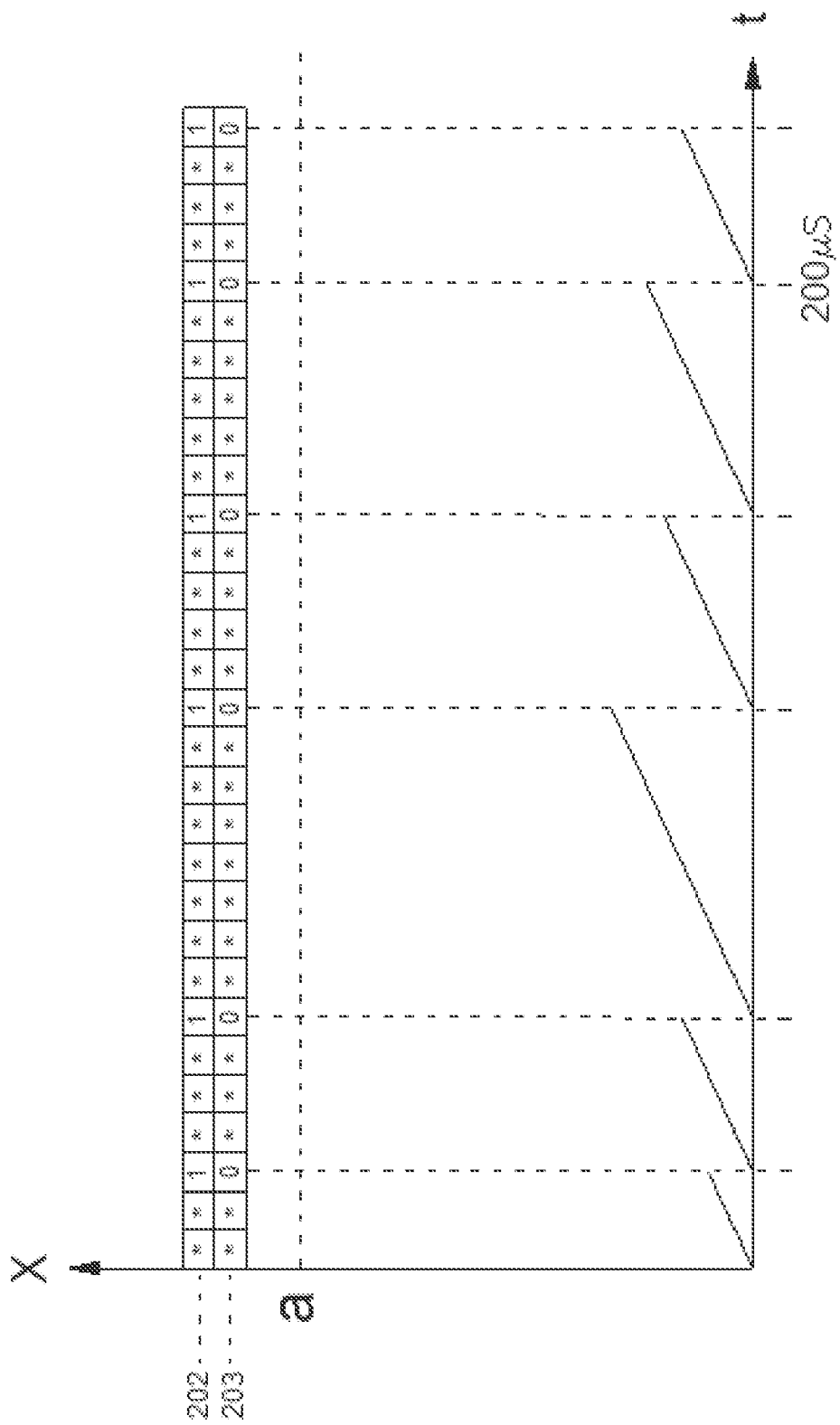
FIG. 12 is a schematic diagram of the counter counting in watchdog.

As shown in FIG. 12, the counter 2002 always counts within a preset time, the preset time is greater than the time that the data signal is input and output from the driving module 21, also the number of bits of the data signal. In this example, the data signal comprises 48 bit, that is, the time from input to output in the driving module 21 is 30 microseconds (μs), and the preset time is set to 200 microseconds in this example, which far exceeds the length of the data signal. It can be seen from the figure that whenever the input signal collection port 203 is 0 and the output signal collection port 202 outputs 1, the detection output port 2003 will output a low level 0 to the counter 2002, so the counter 2002 is reset and counts again, and the control port 201 outputs a low level 0. At this time, the selection port of the data direction selector 205 will receive the control signal 0, and the first input branch is strobed, the second input branch is closed, so that the data signal is input from the first signal end 100a; Because the control port 201 outputs a low level to the control end of the first switch device 207, the first switch device 207 is turned off and the first output branch is turned off; Because the low level output by the control port 201 is inverted by the inverter 204 and then turned into a high level and output to the second switch device 209, the second switch device 209 is turned on and the second output branch is turned on; data signal is output from the second signal end 100b. That is, the data signal is input from the first signal end 100a on the left side and output from the second signal end 100b on the right side.

Figure 13:
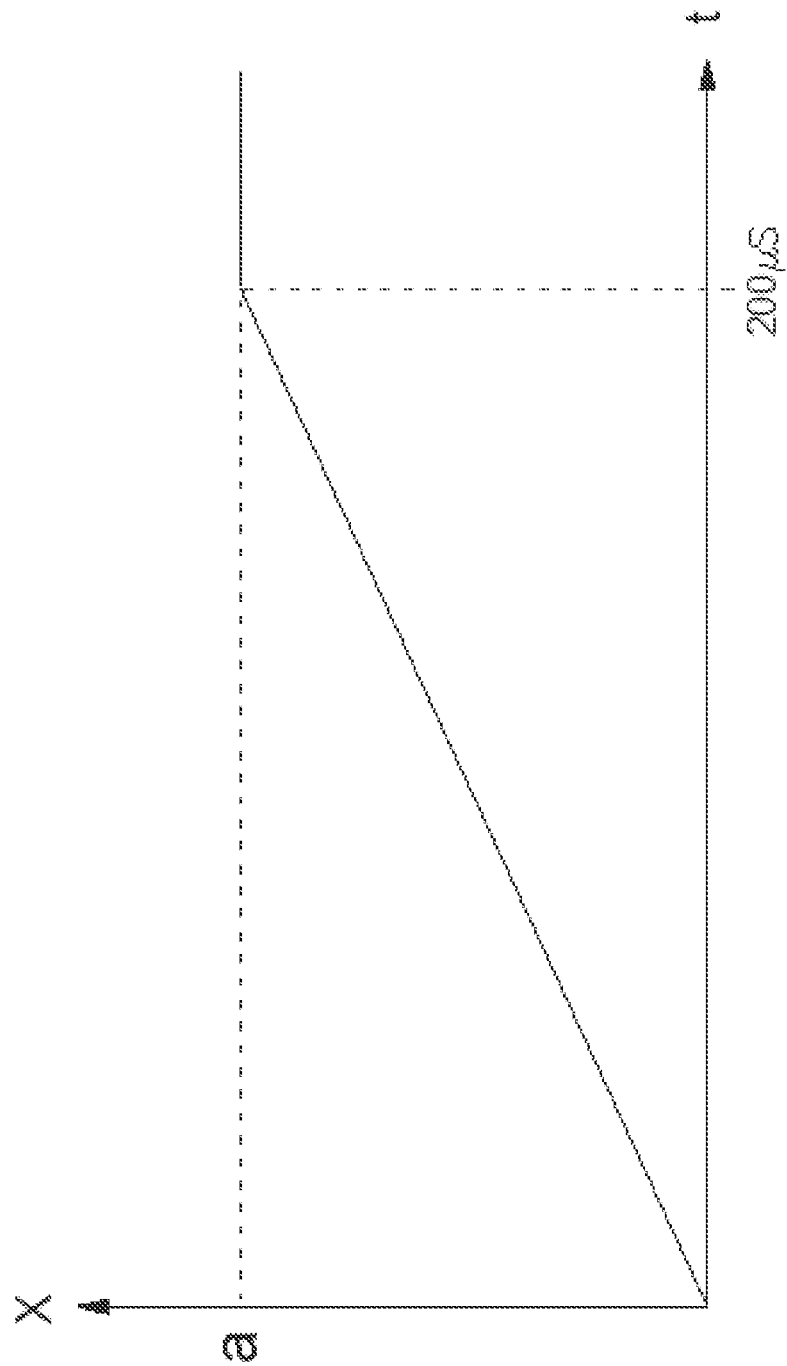
FIG. 13 is a schematic diagram when the counter count in watchdog exceeds the preset value.

As shown in FIG. 13, only when the state of "the input signal collection port 203 is 0 and the output signal collection port 202 outputs 1" does not appear within the preset time of 200 microseconds, the detection output port 2003 will continuously output 1, so that the counter 2002 will continuously count, and when the counting reaches or exceeds its preset value "a", the control port 201 will output a high level 1. That is, when the selection port of the data direction selector 205 receives control signal 1, the second input branch is strobed and the first input branch is closed, so that the data signal is input from the second signal end 100b. Because the control port 201 outputs a high level to the control end of the first switch device 207, the first switch device 207 is turned on and the first output branch is turned on; Because the high level output by the control port 201 is inverted by the inverter 204 and then turned into a low level and output to the second switch device 209, the second switch device 209 is turned off and the second output branch is turned off; data signal is output from the first signal end 100a. Meanwhile, the data signal output from the data output passes through the first switch device 207 and then through the first diode 206 and is collected by the input signal collection port 203, by this time, the signals collected by the input signal collection port 203 and the output signal collection port 202 are always equal, therefore, the output of the control port 201 is maintained at high level 1. So that the data signal is input from the second signal end 100b on the right side and output from the first signal end 100a on the left side.

Figure 6B:
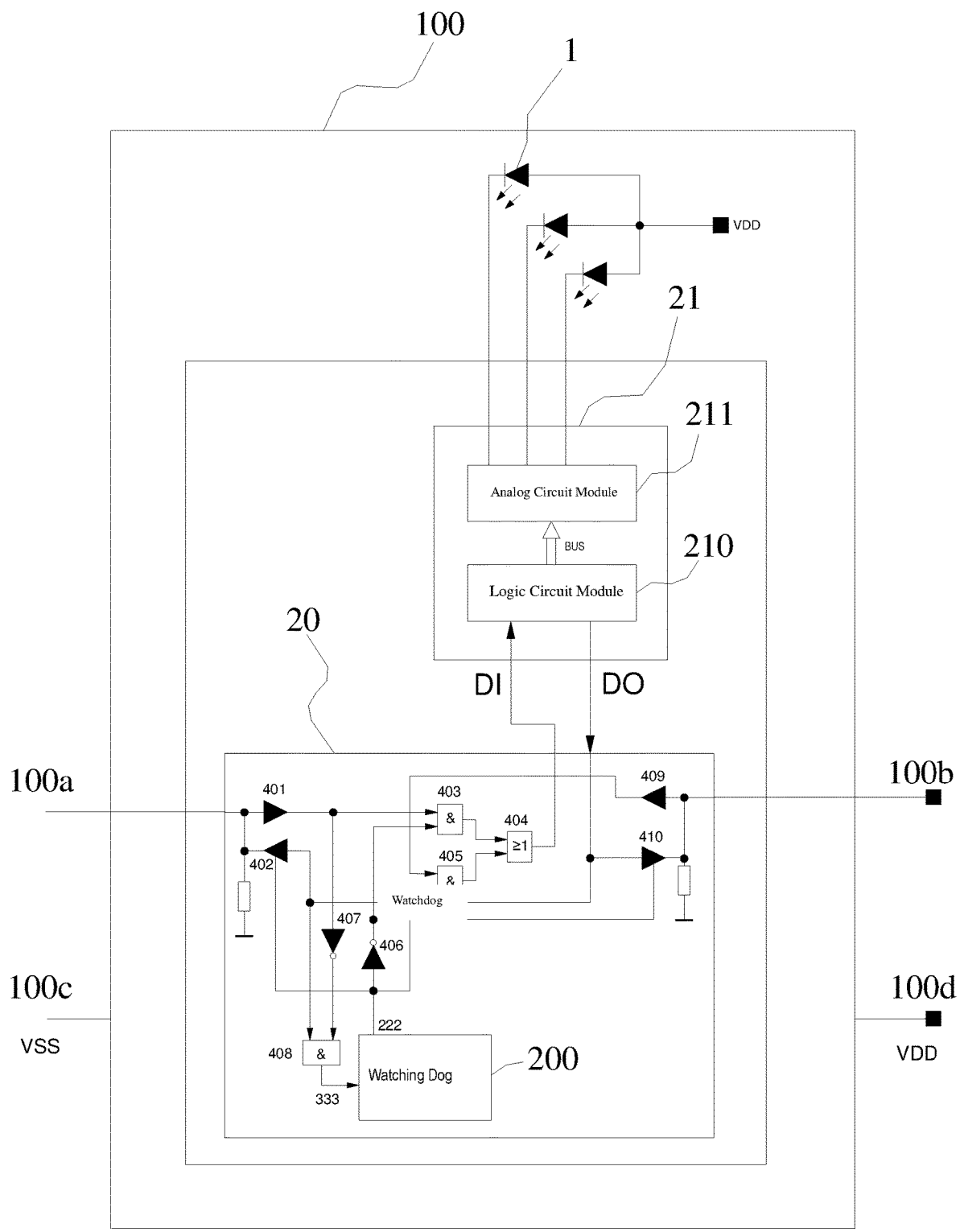
FIG. 6b is a schematic diagram of an another further detailed circuit frame of the LED lamp provided in an embodiment of the present disclosure.

As another way, another implementation of the data direction judgment & switch module 20 and the driving module 21 of the LED lamp 100 is given in the embodiment. As shown in FIG. 6b, the data direction judgment & switch module 20 also includes a data input circuit, a data output circuit and a watchdog 200 (WD).

the data input circuit includes two input branches connected to the data input DI, and the two input branches are respectively connected to the first signal end 100a and second signal end 100b;

the data output circuit includes two output branches connected to the data output, and the two output branches are respectively connected to the first signal end 100a and second signal end 100b;

the watchdog 200 is used for judging the data signal input directions of the first signal end 100a and second signal end 100b, and controlling selection of input branches from the data input circuit and output branches from the data output circuit, so that the data signal is always input from one signal end and output from another signal end.

The data input circuit comprises a first AND gate 403, a second AND gate 405 and an OR gate 404; wherein the first signal end 100a is connected to an input end of the first AND gate 403 through a fourth diode 401 to form a first input branch; the second signal end 100b is connected to an input end of the second AND gate 405 through a fifth diode 409 to form a second input branch; the output ends of the first AND gate 403 and the second AND gate 405 are connected to an input end of the OR gate 404, and an output end of the OR gate is connected to the data input DI.

The data output circuit comprises a first output branch and a second output branch, the first output branch is connected between the first signal end 100a and the data output DO through a third switch device 402; and the second output branch is connected between the second signal end 100b and the data output DO through a fourth switch device 410.

The watchdog 200 includes a control input port 333 and a control output port 222, and the control input port 333 is connected to the output end of a third AND gate 408. An input end of the third AND gate 408 is connected to data output DO, and the other input end is connected to the first signal end 100a through a second NOT gate 407. The control output port 222 is connected to the other input end of the second AND gate 405 and the control end of the third switch device 402, and connected to the other input end of the first AND gate 403 and the control end of the fourth switch device 410 through a first NOT gate 406.

The data direction judgment & switch module 20 also makes the input and output of data signal match the following results: when the data signal is input from the first input branch, the data signal is output from the second output branch; or when the data signal is input from the second input branch, the data signal is output from the first output branch.

The working process is as follows: the system sets that when the control input port 333 of the watchdog 200 receives the input signal 1, the counter in the watchdog 200 is cleared and reset, before the counter reaches the set value "a" (it will reach the set value "a" if it does not stop counting), the output of the control output port 222 is 0. When the control input port 333 receives the input signal 0, the counter in the watchdog 200 keeps counting until it reaches the value "a" (after 200 microseconds), and the output of the control output port 222 is 1.

After power-on, before the data signal is available, the counter in the watchdog 200 starts counting. Within 200 microseconds, before the counter reaches the set value "a", the output value of the control output port 222 of the watchdog 200 is 0, and after passing through the first NOT gate 406, it is 1. At this point, if a data signal is input from the first signal end 100a, it certainly contains level signals of 0 and 1, so the signal level passing through the first AND gate 403 always keeps the same as the signal level input from the first signal end 100a (the reason is that the level from the first NOT gate 406 is 1), and then passes through the OR gate 404. The OR gate 404 receives signals from the second AND gate 405 at the same time, and in the second AND gate 405, the signal from the fifth diode 409 is high level 1, the signal from the control output port 222 is 0, then the signal output to the OR gate 404 through the second AND gate 405 must be 0, and then the signal passing through the OR gate 404 is input to the data input DI as it is, and output from the data output DO. By this time, the control signal of the third switch device 402 is level 0 (from the control output port 222), so it will not be output from the third switch device 402, but will only be output from the fourth switch device 410 (the control signal of the fourth switch device 410 is 1 after passing through the reverse level of the first NOT gate 406).

If the signal is continuously input from the first signal end 100a, the level after passing through the fourth diode 401 will always contain level signal 0, the level signal 0 will become level signal 1 after passing through the second NOT gate 407, meanwhile the third AND gate 408 also receives the data signal from the data output DO, either signal 1 or signal 0 contains at least 30% of high-level signals. Under the clock of 100 MHz, each signal will be detected for 62.5 times in 625 ns, so there is enough time to detect the input signals which are simultaneously 1 within 200 microseconds, then the third AND gate 408 will output the level signal 1 to the control input port 333, making the clock in the watchdog 200 reset continuously within 200 microseconds, and always let the control output port 222 output control signal 0, thus ensuring that the data is input from the first signal end 100a and output from the second signal end 100b.

If no signal is input from the first signal end 100a, the output signal of the fourth diode 401 is 1, which becomes 0 after passing through the second NOT gate 407, and the level signal input to the control input port 333 after being transmitted to the third AND gate 408 is 0. The counter of watchdog 200 keeps counting until it reaches the value "a", then the control signal of the control output port 222 outputs 1, and the signal output to first AND gate 403 and fourth switch device 410 after passing through the first NOT gate 406 is 0, then the first AND gate 403 always outputs a signal 0 to the OR gate 404, at this time, if a signal is input from the second signal end 100b, it is input to the second AND gate 405 after passing through the fifth diode 409. Because the signal given to the second AND gate 405 through the control output port 222 is 1, the signal from the fifth diode 409 remains consistent after passing through the second AND gate 405, and the signal after passing through the OR gate 404 also remains consistent, until being input to the data input DI and then output from data output DO. Because the control signal of the fourth switch device 410 is 0, it will not be output from the fourth switch device 410, but will be output to the first signal end 100a through the third switch device 402. Meanwhile, the signal passing through the third switch device 402 will return to the second NOT gate 407 from the fourth diode 401 and then output to the third AND gate 408, so the signal received by the third AND gate 408 is always in the opposite state of 0 and 1, and the signal received by the control input port 333 is always 0. Therefore, the control output port 222 always keeps outputting a signal 1, and keeps signal input from the second signal end 100b and conducted to the first signal end 100a for output.

For the LED lamp 100 provided by the application, the two signal ends can input and output data signals without distinguishing data directions. The data direction judgment & switch module 20 judges the data signal input directions of the first signal end 100a and the second signal end 100b, automatically switches the signal input end and signal output end for the data signal, inputs data signal from the data input and outputs the data signal to the driving module 21, receives data signal returned from the driving module 21, and outputs the data signal from the data output. Therefore, when it is used in LED display screen 1000 and other equipment, the arrangement or wiring of each LED lamp 100 does not need to be specially designed. Under the condition that the arrangement direction of the LED lamp 100 does not need to be changed among rows (or columns), the heads or tails of the LED lamps 100 of adjacent rows (or adjacent columns) are connected in series, thus avoiding the use of head-to-tail wiring for winding layout and greatly reducing the complexity of wiring. And there is no color difference between the LED lamps 100 in adjacent rows or columns.

Embodiment 2

In this embodiment, the LED display screen 1000 provided by the present application will be explained in detail. In this embodiment, the LED display screen 1000 is prepared using the LED lamp shown in FIG. 6a as an example.

Figure 14:
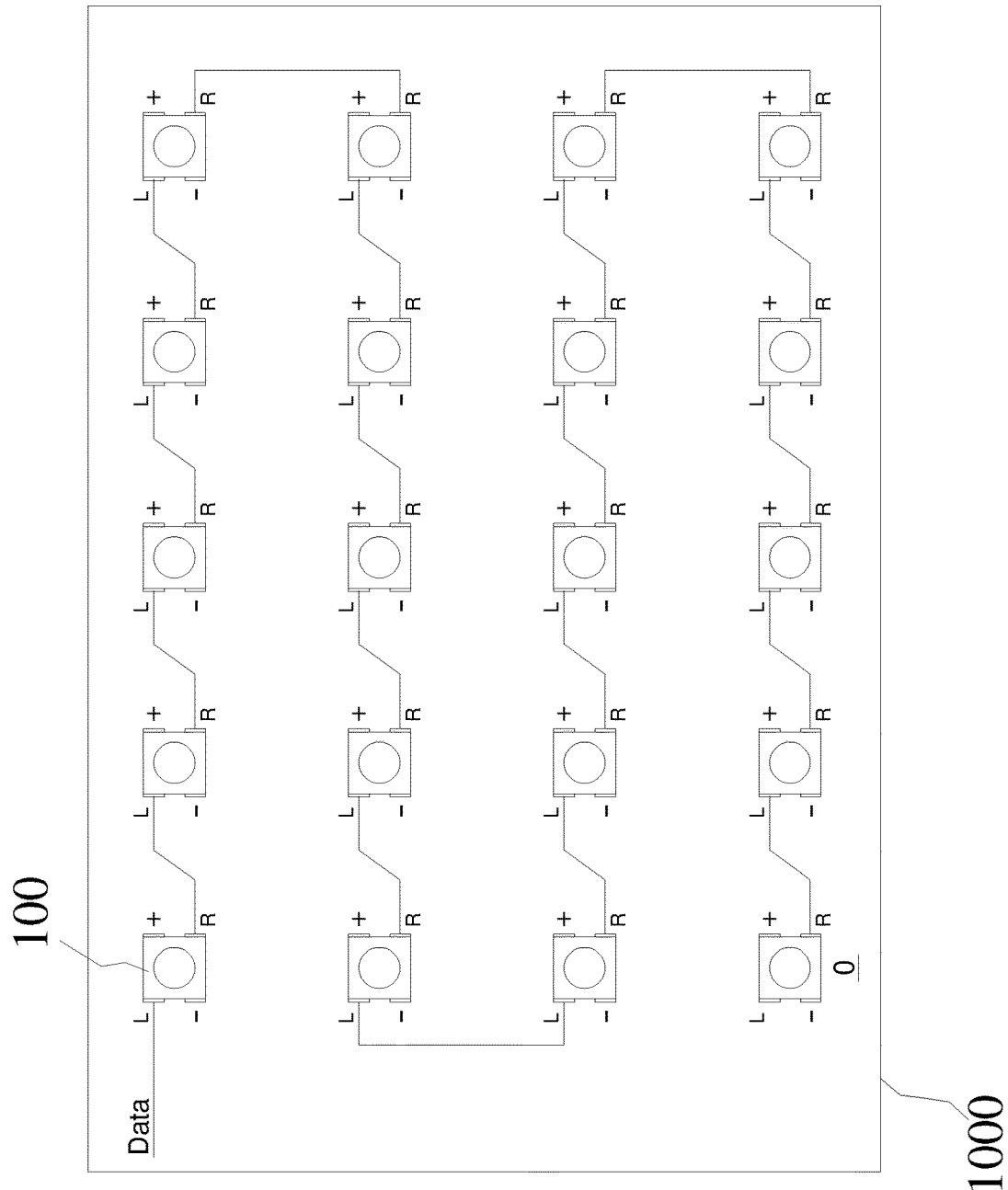
FIG. 14 is a schematic diagram of a circuit frame of the LED display screen provided in an embodiment of the present disclosure.

As shown in FIG. 14, an LED display screen 1000 is provided in this embodiment, which includes an LED array, the LED array includes the LED lamps 100 arranged in the same direction as described in Embodiment 1.

Figure 18:
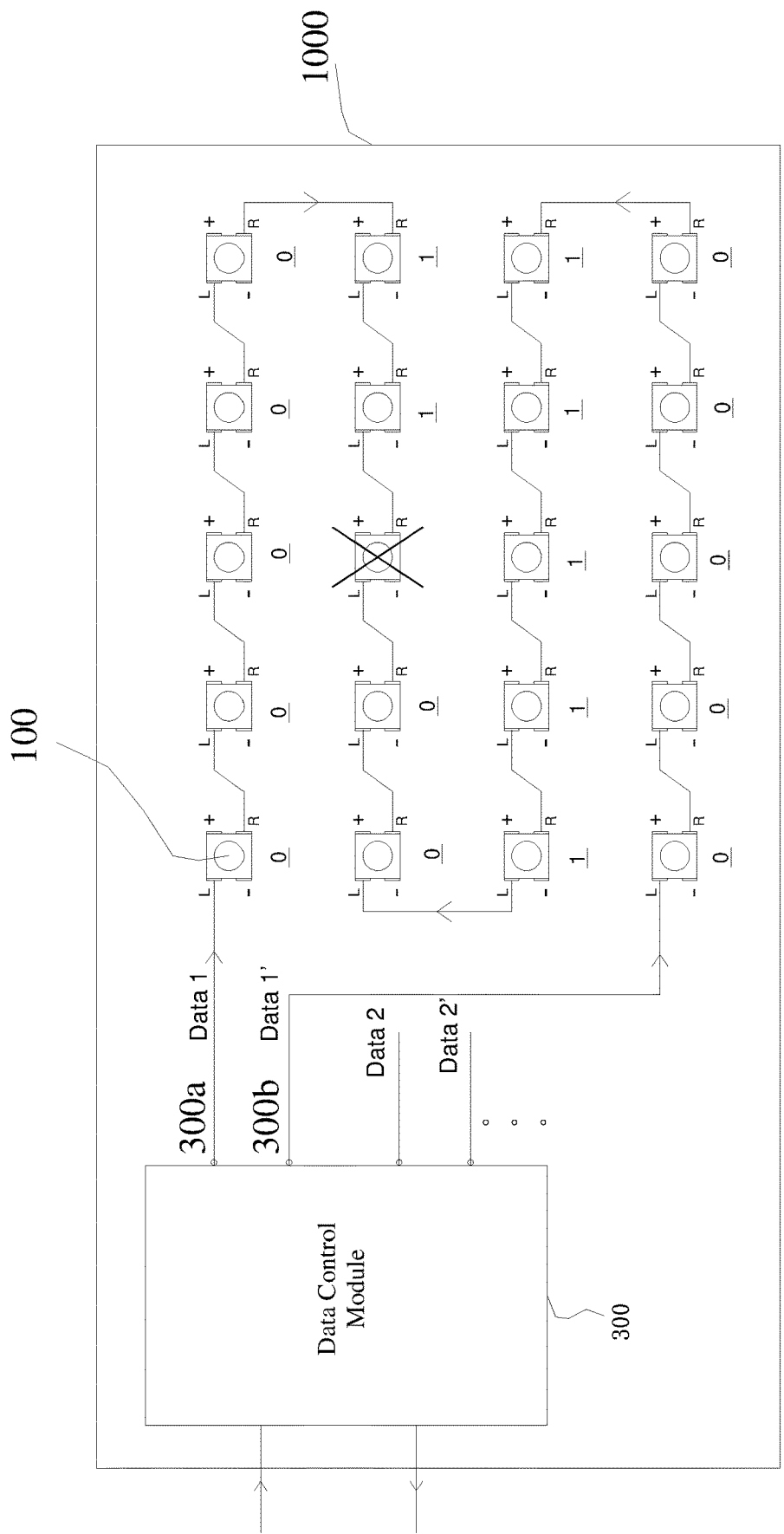
FIG. 18 is a control schematic diagram of the LED display screen provided in an embodiment of the present disclosure.

As shown in FIG. 18, the LED display screen 1000 further includes a data control module 300 (DCM). The data control module 300 is provided with a plurality of first data ports 300a and second data ports 300b; part of the LED lamps 100 of the LED array are connected in series among the first data ports 300a and the second data ports 300b. Data signal is transmitted from the first data port 300a to the LED lamp 100 and then to the second data port 300b.

Wherein, arrays composed of LED lamps connected in series among the first data ports 300a and the second data ports 300b are divided into a plurality of rows or columns connected in series, and the LED lamps 100 of adjacent rows or adjacent columns are connected head-to-head or tail-to-tail.

In this embodiment, the LED display screen 1000 displayed in arrays, all the LED lamps 100 in a display screen can be connected in series to form a lamp assembly, or can be divided into a lamp assembly formed by connecting a plurality of LEDs in series. When connecting in series, the LEDs can be connected in rows (or columns). Taking the series connection in rows as an example, it is preferable to connect the heads or tails between adjacent rows.

Specifically, the above-mentioned "connected head-to-head or tail-to-tail in series" means that the LED lamps 100 in each row are connected in series, and the LED lamps 100 in the tail of each row are connected with the LED lamps 100 in the tail of adjacent row, or the LED lamps 100 in the head of each row are connected with the LED lamps 100 in the head of adjacent row, so that the LED lamps 100 in each row connected in series form a snake shape with the head connected in series or the tail connected in series. For example, as shown in FIG. 14, a lamp assembly in the LED display screen 1000 includes four rows of LED lamps 100; the LED lamps 100 in the lamp assembly are placed in the same direction, so that the left signal end is first signal end 100a and the right signal end is second signal end 100b. It can be seen that, except the head and tail, the adjacent LED lamp 100 in each row is the first signal end 100a of the next LED lamp 100 connected with the second signal end 100b of the previous LED lamp 100. The heads or tails of each rows are connected head-to-head or tail-to-tail in series, that is, the first signal end 100a of the first LED lamp 100 (or head LED lamp) in the first row is connected to the first data port 300a of the data control module 300, the LED lamp 100 at the tail of the first row is connected to the LED lamp 100 at the tail of the second row, the LED lamp 100 at the head of the second row is connected to the LED lamp 100 at the head of the third row; the LED lamp 100 at the tail of the third row is connected to the LED lamp 100 at the tail of the fourth row; the LED lamp 100 at the head of the fourth row is connected to a second data interface.

Figure 15:
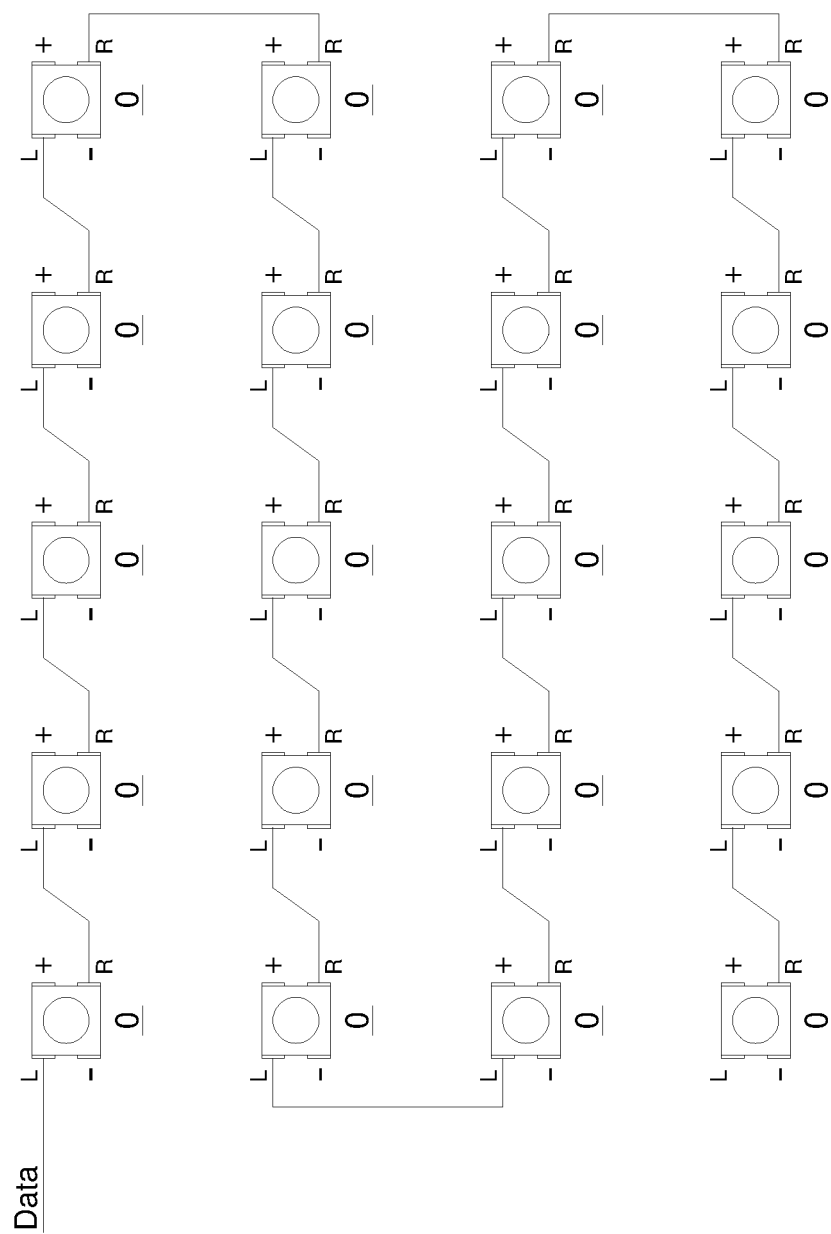
FIG. 15 is a schematic diagram of control signal output by watchdog when the LED display screen initializes after power start for less than 200 microseconds in an embodiment of the present disclosure.

The working process is as follows:

As shown in FIG. 15, when the system is powered on, neither the first signal end 100a nor the second signal end 100b has data signal input, and the first signal end 100a and the second signal end 100b are pulled high after being powered on due to pull-up resistors, and output high level continuously by default. The counter 2002 of the watchdog 200 starts to work, and the control signal output by the control port 201 of the watchdog 200 is 0 before it reaches 200 microseconds.

Figure 16:
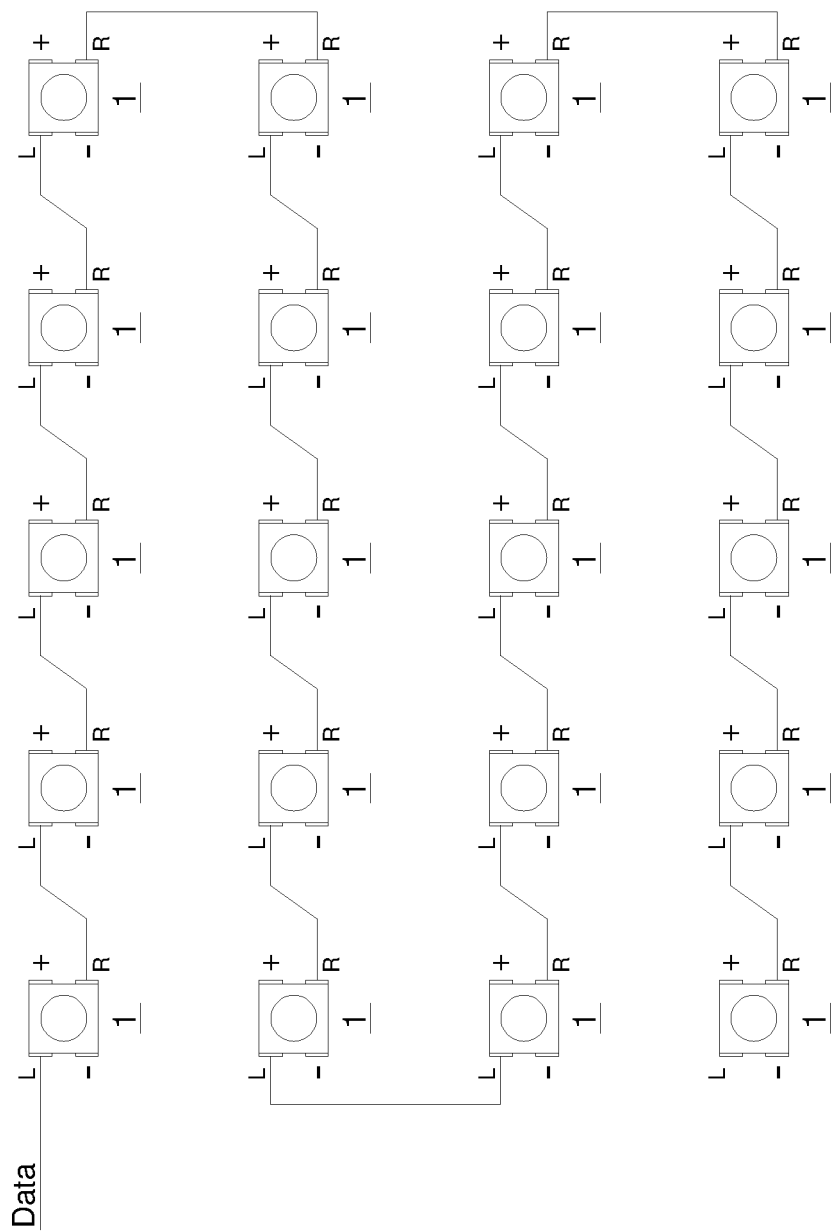
FIG. 16 is a schematic diagram of control signal output by watchdog in each LED lamp after the LED display screen provided in an embodiment of the present disclosure is powered on for more than a preset time (200 microseconds)

As shown in FIG. 16, if the LED display screen is powered on for more than 200 microseconds and no data signal is input, then the control signal output by the control port 201 of the watchdog 200 of each LED lamp is 1. Data signal is allowed to enter the second input branch from the second signal end 100b, the data signal is input to the data input DI of the driving module 21 through the data direction selector 205, then output from the data output of the driving module 21, and output from the first signal end 100a through the first output branch. But at this time, there is no data signal input.

Figure 17:
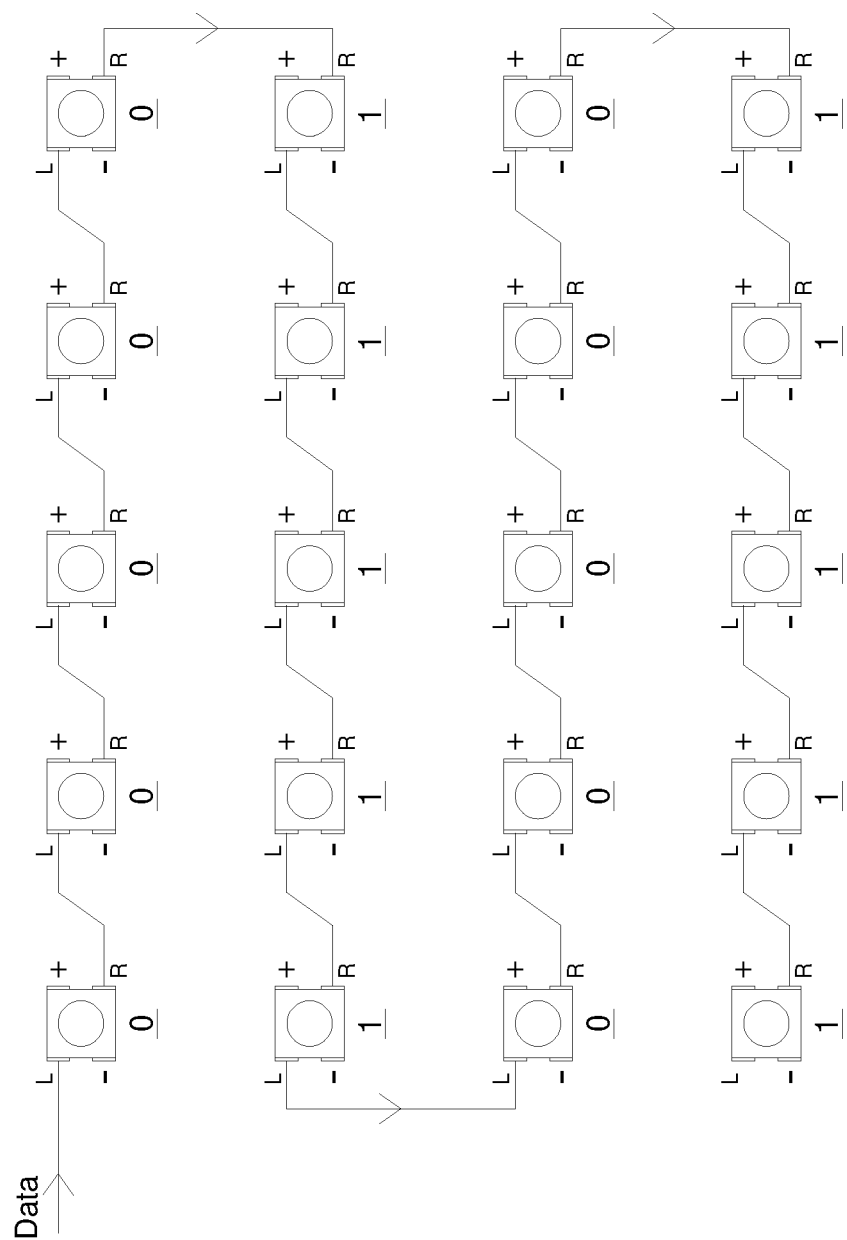
FIG. 17 is a schematic diagram of control signal output by watchdog in each LED lamp after the LED display screen provided in an embodiment of the present disclosure starts to input data from the left side of the first row.

As shown in FIG. 17, if the system starts to send data signal from the left, in the state where the signal is input from the left, the input signal of the input signal collection port 203 will certainly contain a low level signal 0 within 200 microseconds, and the data signal of the output signal collection port 202 will also contain a high level signal 1. The counter 2002 of the watchdog 200 keeps reset for 200 microseconds, and the control signal output from the control port 201 of the watchdog 200 to the data direction selector 205 keeps low level 0, which ensures that the signal is conducted from the first signal end 100a on the left side to the second signal end 100b on the right side. When the data direction selector 205 receives signal 0, the first switch device 207 is turned off and the second switch device 209 is turned on, so that the first input branch and the second output branch form a path. The data signal input by the first signal end 100a is input to the data input DI of the driving module 21 through the data direction selector 205, then output from the data output of the driving module 21, and output to the next LED lamp through the second switch device 209 to the second signal end 100b.

For the rightmost LED lamp 100 in the second row, the signal comes from the rightmost LED lamp 100 in the first row, and the data signal is transmitted from the second signal end 100b to the first signal end 100a, so there is certainly no signal input from the first signal end 100a in 200 microseconds. The watchdog 200 counts continuously within 200 microseconds, and after reaching 200 microseconds, the counter 2002 of the watchdog 200 reaches the set value, then the control signal output by the control port 201 will output 1, at this time, the data direction selector 205 will receive a high level of 1 and strobe the second input branch. Meanwhile, the first switch device 207 is turned on, the second switch device 209 is turned off, and the first output branch is strobed. So that the data signal is transmitted from the second signal end 100b to the data input DI of the driving module 21 through the data direction selector 205 and the second input branch, and then output from the data output DO and transmitted to the first signal end 100a through the first output branch. At this time, the output signal of data output DO is not only input to the output signal collection port 202, but also transmitted back to the input signal collection port 203 through the first switch device 207 and the first diode 206. Then the collected signals of the input signal collection port 203 and the output signal collection port 202 always keep the same input signal of 0 or 1, and at this time, the watchdog 200 performs nothing, and the control port 201 keeps outputting high level 1. Therefore, as long as the signal of the second signal end 100b is continuous, it can be transmitted to the first signal end 100a.

For the LED lamps 100 in the third row, the signal is input from the left, and the data signal of the leftmost LED lamp 100 comes from the leftmost LED lamp 100 in the second row. For the LED lamps 100 in the third row, the data signal is input from the first signal end 100a and output from the second signal end 100b. The input signal of the input signal collection port 203 will certainly contain a low level signal 0 within 200 microseconds, and the data signal of the output signal collection port 202 will also contain a high level signal 1. The counter 2002 of the watchdog 200 keeps reset for 200 microseconds, and the control signal output from the control port 201 of the watchdog 200 to the data direction selector 205 keeps low level 0, which ensures that the signal is conducted from the first signal end 100a on the left side to the second signal end 100b on the right side. When the data direction selector 205 receives signal 0, the first switch device 207 is turned off and the second switch device 209 is turned on, so that the first input branch and the second output branch form a path. The data signal input by the first signal end 100a is input to the data input DI of the driving module 21 through the data direction selector 205, then output from the data output of the driving module 21, and output to the next LED lamp through the second switch device 209 to the second signal end 100b.

The signal data transmission direction and control logic of the LED lamps 100 in the fourth row are the same as those in the second row, and will not be described again.

The LED display screen 1000 provided by the embodiment of the application is internally arranged with the improved and innovated LED lamps, so that the arrangement or wiring of each LED lamp does not need to be specially designed. Under the condition that the arrangement direction of the LED lamp does not need to be changed among rows (or columns), the heads or tails of the LED lamps of adjacent rows (or adjacent columns) are connected in series, thus avoiding the use of head-to-tail wiring for winding layout and greatly reducing the complexity of wiring. And there is no color difference between the LED lamps 100 in adjacent rows or columns.

Embodiment 3

During the research and development, the applicant found that the signal data of the existing LED display screen 1000 is always transmitted in one direction, which requires that the data signal always enter from the signal input end and output from the signal output end; in this case, if any of the LED lamps fails and the signal is interrupted, the data signal can no longer be transmitted, then the damaged LED lamp 100 and its subsequent normal LED lamps 100 cannot work properly.

As shown in FIG. 18, for unidirectional transmission, even with the improved LED display screen 1000 in Embodiment 2 of this application, when the LED lamp 100 fails, the data signal cannot be continuously transmitted. For example, if an LED lamp in the middle of the second row is damaged on the way, the conducted data signal is interrupted at the position of this LED lamp, then all the remaining LED lamps 100 connected in series from the left side of this LED lamp will be interrupted, resulting in display failure.

Figure 19:
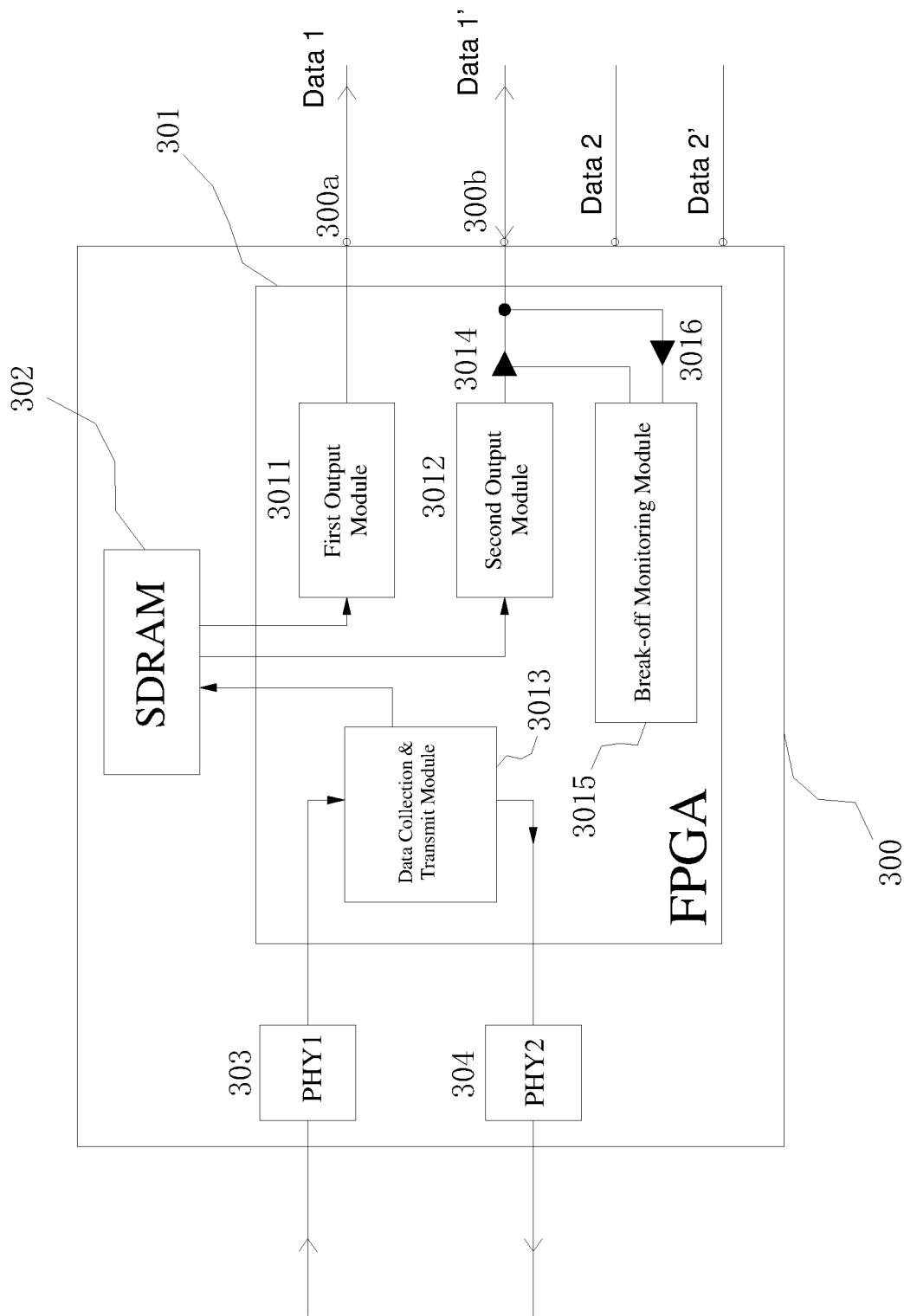
FIG. 19 is a specific schematic diagram of the data control module provided in FIG. 18.

As an improvement, the applicant improved the data control module 300. As shown in FIG. 19, the data control module 300 includes two physical network interfaces (PHY1 and PHY2), an FPGA301 and a memory. The memory in this embodiment is SDRAM (Synchronous Dynamic Random-Access Memory) 302.

The FPGA301 includes a data collection & transmit module 3013, a first output module 3011, a second output module 3012 and a break-off monitoring module 3015;

The data collection & transmit module 3013 is connected with the two physical network interfaces and the memory, and is used for collecting and transmitting data packet, and obtaining data signal from the data packet and storing the data signal in the memory. Specifically, the two physical network interfaces include a first physical network interface 303 (PHY1) and a second physical network interface 304 (PHY2). The data collection & transmit module 3013 receives data packet from the first physical network interface 303, transmits the data packet through the second physical network interface 304, and obtains the data signal for the data control module 300 to control the corresponding LED array from the collected data packet.

The first output module 3011 is used to call the data signal (labeled as Data1, Data2, . . . , in FIGS. 18 and 19) stored in the memory, and send the data signal to the lamp assembly formed by the corresponding serially connected LED lamps 100 through the first data port 300*a*. The A data signal is transmitted from the first to the last among the serially connected LED lamps 100. Each LED lamp 100 obtains its corresponding driving signal, which drives the light emitting chip 1 in the LED lamp 100 to emit light.

The second output module 3012 is used to call the reverse signal of the data signal stored in the memory as a backup signal (labeled as Data1', Data2', . . . , in FIGS. 18 and 19), and send the backup signal to the lamp assembly formed by the corresponding serially connected LED lamps 100 through the second data port 300*b*. That is, the backup signal is reversely transmitted from the last LED lamp 100 to the first LED lamp 100.

A backup switch device 3014 is arranged between the second output module 3012 and the second data port 300*b*, and the backup switch device 3014 is used to control the on-off of the backup signal sent by the second output module 3012.

The break-off monitoring module 3015 is connected to the control end of the backup switch device 3014, and to the second data port 300*b* through the third diode 3016, and is used for collecting data of the second data port 300*b* and outputting a backup control signal to the control end of the backup switch device 3014.

The working process is as follows:

As shown in FIG. 6*a*, taking the data direction judgment & switch module 20 as an example, during normal operation, the first output module 3011 calls the data signal stored in the memory and sends it from the LED lamp 100 on the left side of the first row through the first data port 300*a* to the LED lamp 100 connected in series among the first data ports 300*a* and the second data ports 300*b*. When a damaged LED lamp 100 appears in the second row, the data signals of all LED lamps 100 starting from the left side of the damaged LED lamp will be interrupted, and the signals collected by the watchdog 200, input signal collection port 203 and output signal collection port 202 of the LED lamps 100 behind the damaged LED lamp 100 are all 1. After this state lasts for 200 microseconds, the break-off monitoring module 3015 of the data control module 300 monitors that the data signal input by the second data port 300*b* from the third diode 3016 is interrupted for more than 200 microseconds. At this time, the break-off monitoring module 3015 will send out a control signal to turn on the backup switch device 3014, so that the backup signal Data 1' of the data control module 300 is sent out. Therefore, the leftmost LED lamp in the last row will receive the backup signal Data 1'. The data sequences of the backup signal Data 1' and the data signal Data 1 are reversed, so the signal can be transmitted from the leftmost LED lamp in the last row to the LED lamp on the left side of the damaged LED lamp in the second row, and the image is consistent with the original one. Therefore, the whole LED arrays can work properly except the damaged LED lamp.

Meanwhile, one or more other LED lamp assemblies can be driven in the same way, and different LED lamp assembly images can be put together as a complete image.

The FPGA 301 in the data control module 300 is provided with a first output module 3011, a second output module and an interrupt detection module, data signal can be forward input into the corresponding LED lamps 100 connected in series through the first output module 3011, when an LED lamp in the series-connected lamp assembly breaks down, the break-off monitoring module 3015 can monitor the state of the second data port 300*b* and judge that no data signal has been received; at this time, it can control the backup switch device 3014 to turn on, so that it can send the backward backup signal out through the second output module 3012. Thus, ensuring that the LED lamps 100 behind the damaged LED lamp can still work properly.

The above are only preferred embodiments of the present application, not intended to limit the present application. Any modifications, equivalent substitutions and improvements made within the spirit and principles of the present application should be included in the scope of protection of the present application.

What is claimed is:

1. A driver chip, the driver chip is internally provided with a driving module and connected with a signal end and a power port; the power port is used for providing power for the driver chip; the signal end is used for inputting and outputting data signal;

characterized in that the signal end comprises a first signal end and a second signal end; and the driver chip further comprises a data direction judgment & switch module connected with the driving module; and the data direction judgment & switch module is connected with the first signal end and the second signal end and used for judging data signal input directions of the first signal end and the second signal end, automatically switching signal input end and signal output end for the data signal, importing and transmitting the data signal from the signal input end to the driving module, receiving the data signal returned from the driving module, and outputting the data signal from the signal output end;

the driving module comprises a data input and a data output;

the data direction judgment & switch module comprises a data input circuit, a data output circuit and a watchdog;

the data input circuit comprises two input branches connected to the data input, and the two input branches are respectively connected to the first signal end and second signal end;

the data output circuit comprises two output branches connected to the data output, and the two output branches are respectively connected to the first signal end and second signal end; and the watchdog is used for judging the data signal input directions of the first signal end and the second signal end, and controlling selection of input branches from the data input circuit and output branches from the data output circuit, so that the data signal is always input from one signal end and output from another signal end.

2. The driver chip of claim 1, wherein the data input circuit comprises a data direction selector; the data direction selector is connected with the first signal end, second signal end, watchdog and the data input of the driving module; the data direction selector is connected with the first signal end and the second signal end to form two input branches, and used for switching signal input end connected with data signal according to control signal sent by the watchdog, selecting input branches and outputting data signal from the data direction selector to the data input of the driving module;

the data output circuit is connected to the data output of the driving module, and includes two output branches provided with two switch devices, the two output branches are respectively connected to the first signal end and the second signal end, and the two switch devices always work in inverted states; and the watchdog is directly or indirectly connected with the data input, data output, data direction selector and switch devices on data output circuit, and is used for collecting signals of the data input and data output and identifying signal input end and signal output end of data signal; and sending control signal to the data direction selector and two switch devices on the data output circuit, and an inverter is provided on lines of the two switch devices or the watchdog, but not both.

3. The driver chip of claim 2, wherein the data direction selector comprises a first signal port, a second signal port, a data output and a selection port;

the first signal end is connected with the first signal port through a first diode, and the second signal end is connected with the second signal port through a second diode; the data output is connected to the data input of the driving module;

the data output of the driving module is connected to the first signal end through a first switch device and connected to the second signal end through a second switch device;

the watchdog comprises an input signal collection port, an output signal collection port and a control port;

the input signal collection port is connected to the first signal port of the data direction selector; the output signal collection port is connected to the data output of the driving module; the control port is connected to selection port of the data direction selector and control ends of the first switch device and second switch device, and an inverter is arranged on the control port and the control end of the second switch device; or, the input signal collection port is connected to the second signal port of the data direction selector; the output signal collection port is connected to the data output of the driving module; the control port is connected to selection port of the data direction selector and control ends of the first switch device and second switch device, and an inverter is arranged on the control port and the control end of the first switch device.

4. The driver chip of claim 3, wherein the watchdog comprises a signal detection module and a counter;

and the signal detection module is connected with the input signal collection port and the output signal collection port and is provided with a detection output port; the signal detection module makes logical judgment according to signals collected by the input signal collection port and the output signal collection port, and outputs a detection signal from the detection output port; if it conforms to a specific logic, the detection signal output to the counter is a low level 0, and the counter is reset;

otherwise, the detection signal output to the counter is a high level 1, so that the counter counts; and the counter is used for counting within a preset time, and if counting reaches or exceeds a preset value, output control signal is judged to be a high level 1; otherwise, output control signal is a low level 0.

5. The driver chip of claim 4, wherein rules of logic judgment of the signal detection module is as follows: when signals collected by the input signal collection port and the output signal collection port are not equal, and signal collected by the input signal collection port is a low level 0, signal collected by output signal collection port is a high level 1, then the detection signal output by detection output port is a low level 0; otherwise, the detection signal output by detection output port is a high level 1.

6. The driver chip of claim 5, wherein the frequency of the signal collected by the signal detection module is much higher than the frequency of the data signal; and the data signal is input and output from the driving module by first-in-first-out rule; and the preset time is greater than an input time and output time of the data signal from the driving module.

7. The driver chip of claim 1, wherein the driving module comprises a logic circuit module and an analog circuit module;

the logic circuit module is used for receiving data signal input by the data input, extracting control signal from the data signal and transmitting the control signal to the analog circuit module, and outputting the data signal from the data output; and the analog circuit module is used for generating a plurality of driving signals corresponding to the number of light emitting chips according to the data signal, to drive the corresponding light emitting chips.

8. The driver chip of claim 1, wherein the data input circuit comprises a first AND gate, a second AND gate and an OR gate; wherein the first signal end is connected to an input end of the first AND gate through a fourth diode to form a first input branch; the second signal end is connected to an input end of the second AND gate through a fifth diode to form a second input branch; output ends of the first AND gate and the second AND gate are connected to an input end of the OR gate, and an output end of the OR gate is connected to the data input;

the data output circuit comprises a first output branch and a second output branch, the first output branch is connected between the first signal end and the data output through a third switch device; and the second output branch is connected between the second signal end and the data output through a fourth switch device; and the watchdog comprises a control input port and a control output port, wherein the control input port is connected to an output end of a third AND gate, and an input end of the third AND gate is connected to the data output and the other input end is connected to the first signal end through a second NOT gate; and the control output port is connected to the other input end of the second AND gate and a control end of the third switch device, and is connected to the other input end of the first AND gate and a control end of the fourth switch device through a first NOT gate.

9. An LED lamp, comprising a driver chip, a light emitting chip, a signal port and a power port, wherein a driving module is arranged in the driver chip; and the power port is used for providing power for circuits in the LED lamp; the signal port is used for inputting and outputting data signal; the light emitting chip is connected to the driver chip and driven by the driving module;

characterized in that the signal end comprises a first signal end and a second signal end;

the LED lamp further comprises a data direction judgment & switch module arranged inside or outside the driver chip and connected with the driving module; and the data direction judgment & switch module is connected with the first signal end and the second signal end and used for judging data signal input directions of the first signal end and the second signal end, automatically switching signal input end and signal output end for the data signal, importing and transmitting the data signal from the signal input end to the driving module, receiving the data signal returned from the driving module, and outputting the data signal from the signal output end;

the driving module comprises a data input and a data output;

the data direction judgment & switch module comprises a data input circuit, a data output circuit and a watchdog;

the data input circuit comprises two input branches connected to the data input, and the two input branches are respectively connected to the first signal end and second signal end;

the data output circuit comprises two output branches connected to the data output, and the two output branches are respectively connected to the first signal end and second signal end; and the watchdog is used for judging the data signal input directions of the first signal end and the second signal end, and controlling selection of input branches from the data input circuit and output branches from the data output circuit, so that the data signal is always input from one signal end and output from another signal end.

10. The LED lamp of claim 9, wherein the data input circuit comprises a data direction selector; the data direction selector is connected with the first signal end, second signal end, watchdog and the data input of the driving module; the data direction selector is connected with the first signal end and the second signal end to form two input branches, and used for switching signal input end connected with data signal according to control signal sent by the watchdog, selecting input branches and outputting data signal from the data direction selector to the data input of the driving module;

the data output circuit is connected to the data output of the driving module, and includes two output branches provided with two switch devices, the two output branches are respectively connected to the first signal end and the second signal end, and the two switch devices always work in inverted states; and the watchdog is directly or indirectly connected with the data input, data output, data direction selector and switch devices on data output circuit, and is used for collecting signals of the data input and data output and identifying signal input end and signal output end of data signal; and sending control signal to the data direction selector and two switch devices on the data output circuit, and an inverter is provided on lines of the two switch devices or the watchdog, but not both.

11. The LED lamp of claim 10, wherein the data direction selector comprises a first signal port, a second signal port, a data output and a selection port;

the first signal end is connected with the first signal port through a first diode, and the second signal end is connected with the second signal port through a second diode; the data output is connected to the data input of the driving module;

the data output of the driving module is connected to the first signal end through a first switch device and connected to the second signal end through a second switch device;

the watchdog comprises an input signal collection port, an output signal collection port and a control port;

the input signal collection port is connected to the first signal port of the data direction selector; the output signal collection port is connected to the data output of the driving module; the control port is connected to selection port of the data direction selector and control ends of the first switch device and second switch device, and an inverter is arranged on the control port and the control end of the second switch device; or the input signal collection port is connected to the second signal port of the data direction selector; the output signal collection port is connected to the data output of the driving module; the control port is connected to selection port of the data direction selector and control ends of the first switch device and second switch device, and an inverter is arranged on the control port and the control end of the first switch device.

12. The LED lamp of claim 11, wherein the watchdog comprises a signal detection module and a counter;

and the signal detection module is connected with the input signal collection port and the output signal collection port and is provided with a detection output port; the signal detection module makes logical judgment according to signals collected by the input signal collection port and the output signal collection port, and outputs a detection signal from the detection output port; if it conforms to a specific logic, the detection signal output to the counter is a low level 0, and the counter is reset; otherwise, the detection signal output to the counter is a high level 1, so that the counter counts; and the counter is used for counting within a preset time, and if counting reaches or exceeds a preset value, output control signal is judged to be a high level 1; otherwise, output control signal is a low level 0.

13. The LED lamp of claim 9, wherein the data input circuit comprises a first AND gate, a second AND gate and an OR gate; wherein the first signal end is connected to an input end of the first AND gate through a fourth diode to form a first input branch; the second signal end is connected to an input end of the second AND gate through a fifth diode to form a second input branch; output ends of the first AND gate and the second AND gate are connected to an input end of the OR gate, and an output end of the OR gate is connected to the data input;

the data output circuit comprises a first output branch and a second output branch, the first output branch is connected between the first signal end and the data output through a third switch device; and the second output branch is connected between the second signal end and the data output through a fourth switch device; and the watchdog comprises a control input port and a control output port, wherein the control input port is connected to an output end of a third AND gate, and an input end of the third AND gate is connected to the data output and the other input end is connected to the first signal end through a second NOT gate; and the control output port is connected to the other input end of the second AND gate and a control end of the third switch device, and is connected to the other input end of the first AND gate and a control end of the fourth switch device through a first NOT gate.

14. An LED display screen, comprising the LED lamp of claim 9.

15. The LED display screen of claim 14, wherein the LED lamps form an LED array, and the LED array is arranged in a same direction.

16. The LED display screen of claim 15, further comprising a data control module; and the data control module is provided with a plurality of first data ports and second data ports; part of the LED lamps of the LED array are connected in series among the first data ports and the second data ports.

17. The LED display screen of claim 16, wherein arrays composed of LED lamps connected in series among the first data ports and the second data ports are divided into a plurality of rows or columns connected in series, and the LED lamps of adjacent rows or adjacent columns are connected head-to-head or tail-to-tail.

18. The LED display screen of claim 17, wherein the data control module comprises two physical network interfaces, an FPGA and a memory;

the FPGA includes a data collection & transmit module, a first output module, a second output module and a break-off monitoring module;

the data collection & transmit module is connected with the two physical network interfaces and the memory, and is used for collecting and sending data packet, and obtaining data signal from the data packet and storing the data signal in the memory;

the first output module is used for calling the data signal stored in the memory and sending the data signal to corresponding serially connected LED lamps through the first data port;

the second output module is used for reversely calling the data signal stored in the memory as backup signal, and sending the backup signal to corresponding serially connected LED lamps through the second data port;

a backup switch device is arranged between the second output module and the second data port, and the backup switch device is used for controlling the on-off of the backup signal sent by the second output module; and the break-off monitoring module is connected to a control end of the backup switch device and to the second data port through a third diode, and is used for collecting data of the second data port and outputting a backup control signal to the control end of the backup switch device.

* * * * *